US008409457B2

(12) United States Patent
Zhang et al.

(10) Patent No.: US 8,409,457 B2
(45) Date of Patent: Apr. 2, 2013

(54) METHODS OF FORMING A PHOTORESIST-COMPRISING PATTERN ON A SUBSTRATE

(75) Inventors: Zishu Zhang, Boise, ID (US); Hongbin Zhu, Boise, ID (US); Anton deVilliers, Boise, ID (US); Alex Schrinsky, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 948 days.

(21) Appl. No.: 12/201,744

(22) Filed: Aug. 29, 2008

(65) Prior Publication Data

US 2010/0055913 A1 Mar. 4, 2010

(51) Int. Cl.
*C03C 15/00* (2006.01)
(52) U.S. Cl. ............ 216/41; 216/37; 430/315; 430/322; 430/324; 438/725; 438/736; 438/737
(58) Field of Classification Search ............... 216/37, 216/41; 430/315, 322; 438/725, 736, 737
See application file for complete search history.

(56) References Cited

U.S. PATENT DOCUMENTS

| 4,935,334 | A  | * | 6/1990  | Boettiger et al. ............ 430/322 |
| 5,372,916 | A  |   | 12/1994 | Ogawa et al. |
| 6,249,335 | B1 |   | 6/2001  | Hirukawa et al. |
| 6,376,157 | B1 | * | 4/2002  | Tanaka et al. ................. 430/314 |
| 6,383,952 | B1 |   | 5/2002  | Subramanian et al. |
| 6,548,401 | B1 |   | 4/2003  | Trivedi |
| 6,599,844 | B2 |   | 7/2003  | Koh et al. |
| 6,627,524 | B2 |   | 9/2003  | Scott |
| 6,703,323 | B2 |   | 3/2004  | Kong et al. |
| 6,756,619 | B2 |   | 6/2004  | Tran |
| 6,872,512 | B2 |   | 3/2005  | Yamashita |
| 6,878,646 | B1 |   | 4/2005  | Tsai et al. |

(Continued)

FOREIGN PATENT DOCUMENTS

| EP | 0171111  | 2/1986 |
| JP | 56046531 | 4/1981 |

(Continued)

OTHER PUBLICATIONS

Lee Doo-You et al. Japn.J.Appl.Phys. vol. 46, No. 9B, (2007), pp. 6135-6139.*

(Continued)

*Primary Examiner* — Duy Deo
*Assistant Examiner* — Maki Angadi
(74) *Attorney, Agent, or Firm* — Wells St. John, P.S.

(57) ABSTRACT

A method of forming a photoresist-comprising pattern on a substrate includes forming a patterned first photoresist having spaced first masking shields in at least one cross section over a substrate. The first masking shields are exposed to a fluorine-containing plasma effective to form a hydrogen and fluorine-containing organic polymer coating about outermost surfaces of the first masking shields. A second photoresist is deposited over and in direct physical touching contact with the hydrogen and fluorine-containing organic polymer coating. The second photoresist which is in direct physical touching contact with the hydrogen and fluorine-containing organic polymer coating is exposed to a pattern of actinic energy and thereafter spaced second masking shields are formed in the one cross section which comprise the second photoresist and correspond to the actinic energy pattern. The first and second masking shields together form at least a part of a photoresist-comprising pattern on the substrate. Other embodiments are disclosed.

38 Claims, 18 Drawing Sheets

U.S. PATENT DOCUMENTS

| | | | |
|---|---|---|---|
| 6,905,975 | B2 | 6/2005 | Boettiger et al. |
| 7,166,533 | B2 | 1/2007 | Happ |
| 2005/0130068 | A1 | 6/2005 | Kondoh et al. |
| 2005/0255696 | A1 | 11/2005 | Makiyama et al. |
| 2006/0118785 | A1 | 6/2006 | Allen et al. |
| 2006/0154182 | A1 | 7/2006 | Brodsky |
| 2006/0286795 | A1 | 12/2006 | Yosho |
| 2007/0003878 | A1 | 1/2007 | Paxton et al. |
| 2007/0197014 | A1 | 8/2007 | Jeon et al. |
| 2007/0224537 | A1 | 9/2007 | Nozaki et al. |
| 2007/0248916 | A1* | 10/2007 | Kamijima ............... 430/315 |
| 2007/0264830 | A1 | 11/2007 | Huang et al. |
| 2008/0032243 | A1 | 2/2008 | Jung |
| 2008/0032508 | A1* | 2/2008 | Chang .................... 438/725 |

FOREIGN PATENT DOCUMENTS

| | | |
|---|---|---|
| JP | 58157135 | 9/1983 |
| JP | 59211231 | 11/1984 |
| JP | 2003234279 | 8/2003 |
| JP | 2004247399 | 9/2004 |
| KR | 20030049198 | 6/2003 |
| KR | 20030056601 | 7/2003 |
| KR | 20030089063 | 11/2003 |
| KR | 20040057582 | 7/2004 |
| KR | 10-2006-0064861 | 6/2006 |
| KR | 10-2008-0064457 | 7/2008 |
| WO | PCT/US2009/051529 | 2/2010 |
| WO | PCT/US2009/051529 | 3/2011 |

OTHER PUBLICATIONS

Hori, "Sub-40nm Half-Pitch Double Patterning with Resist Freezing Process", Proc. of SPIE vol. 6923, pp. 69230H-1-69230H-8, (2004).

Lee, "Double-Patterning Technique Using Plasma Treatment of Photoresist", Japanese Journal of Applied Physics, vol. 46, No. 9B, 2007, pp. 6135-6139.

Ma, "Plasma Resist Image Stabilization Technique (PRIST)", 1980 IEEE pp. 574-575.

Fritze et al., "Enhanced Resolution forFuture Fabrication", IEEE Circuits & Devices Magazine, Jan. 2003, pp. 43-47.

Liau et al., "Softbake and Post-exposure Bake Optimization for Process Window Improvement and Optical Proximity Effect Tuning", ICSE 2006 Proc. 2006, Kuala Lumpur, Malaysia, 7 pages.

Owa et al., "Immersion Lithography Ready for 45 nm Manufacturing and Beyond", 2007 IEEE/SEMI Advanced Semiconductor Manufacturing Conference, pp. 238-244.

Pease et al., "Lithography and Other Patterning Techniques for Future Electronics", Proceedings of the IEEE/vol. 96, No. 2, Feb. 2008, pp. 248-270.

Tan et al., "Current Status of Nanonex Nanoimprint Solutions", website: www.nanonex.com/technology.htm, 2004, 9 pages.

Terai et al., "Newly developed RELACS process and materials for 65 nm node device and beyond", website: ieeexplore.ieee.org/iel5/10631/33565/01595193.pdf, pp. 20-21, (2005).

U.S. Appl. No. 12/125,725, filed May 22, 2008 entitled, "Methods of Forming Structures Supported by Semiconductor Substrates", 15 pages.

* cited by examiner

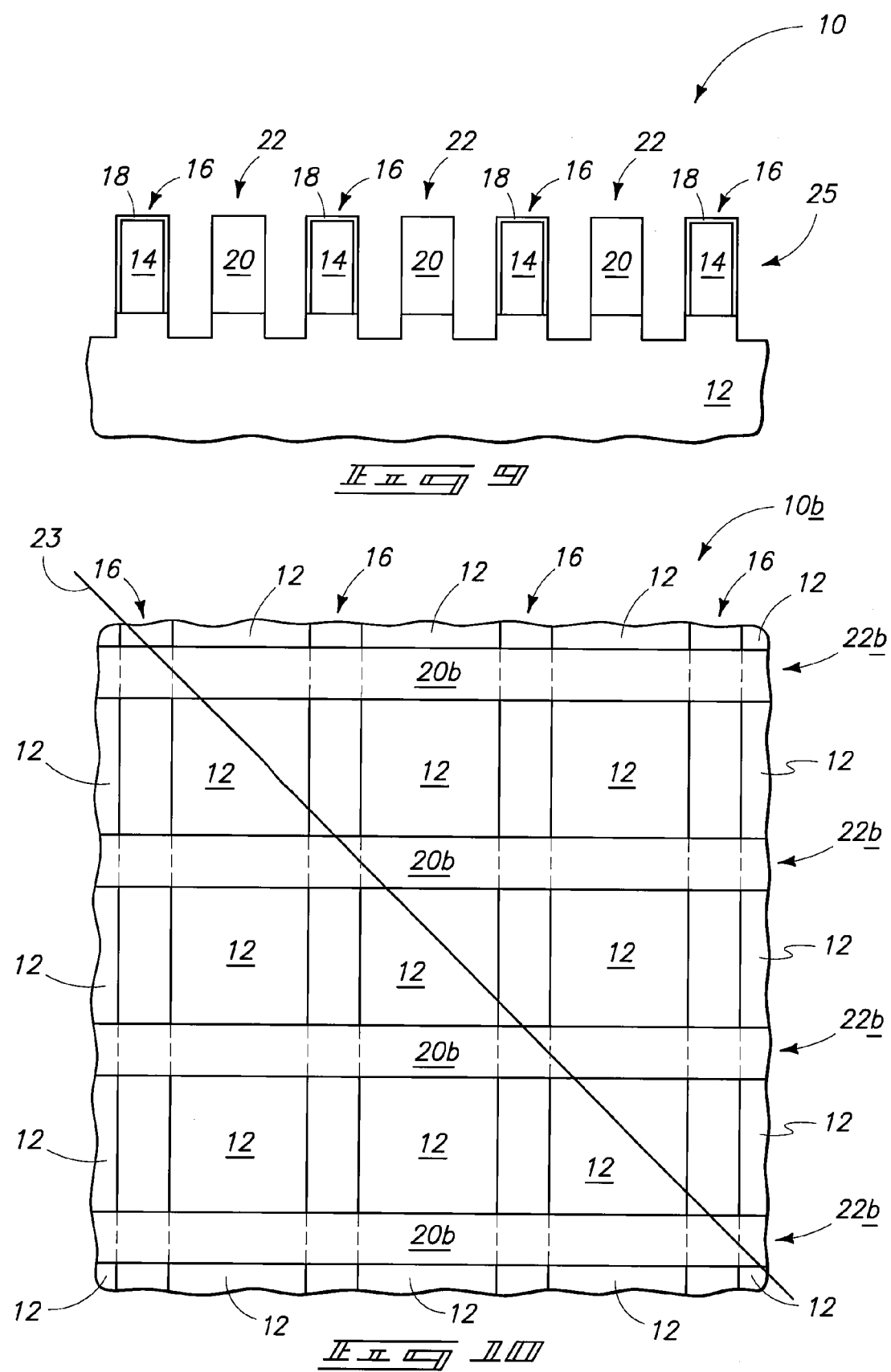

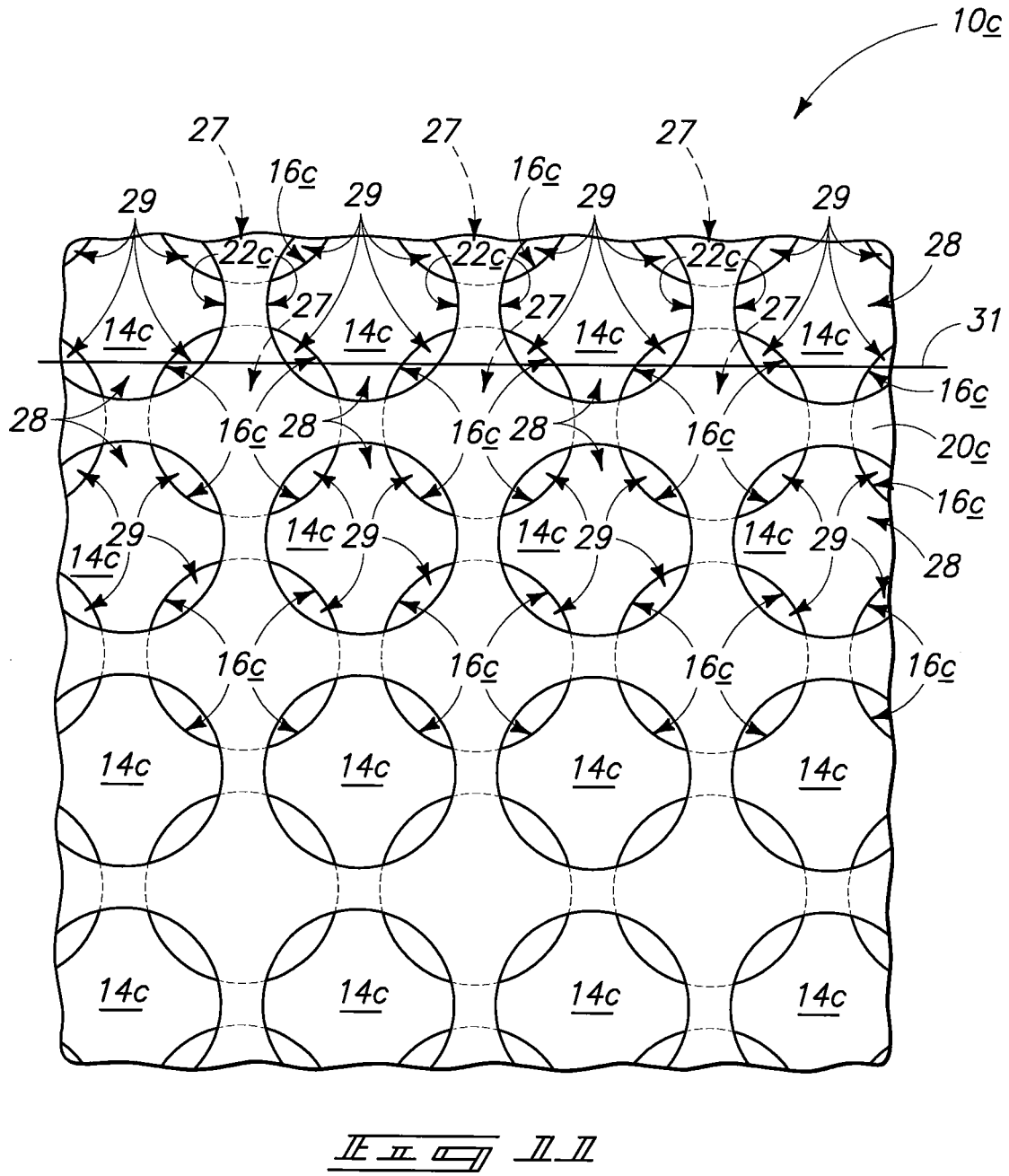

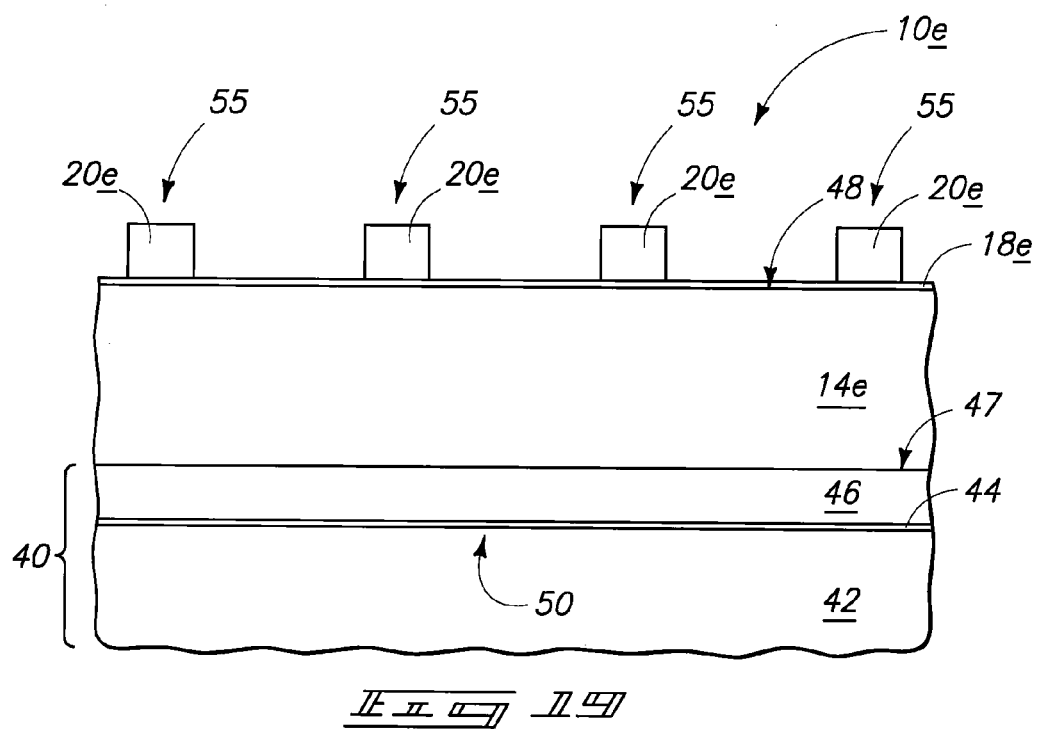
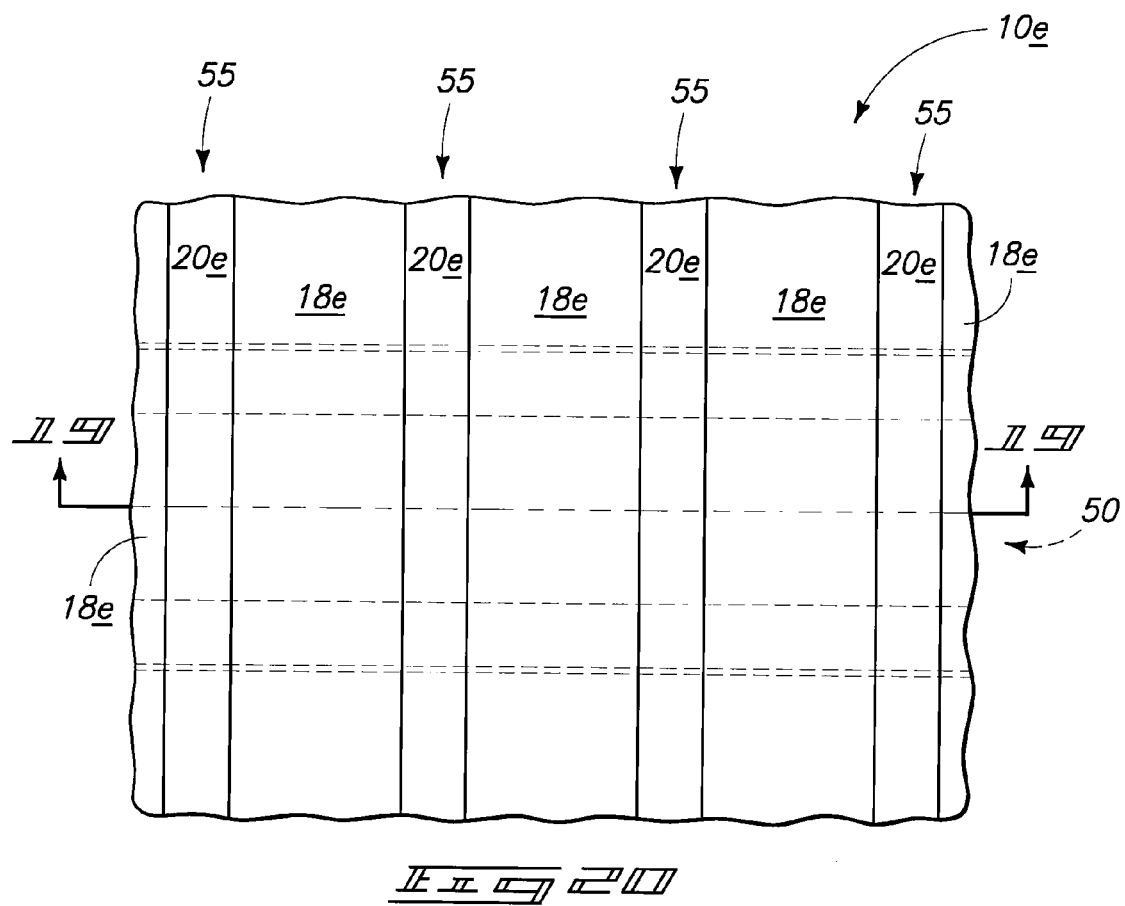

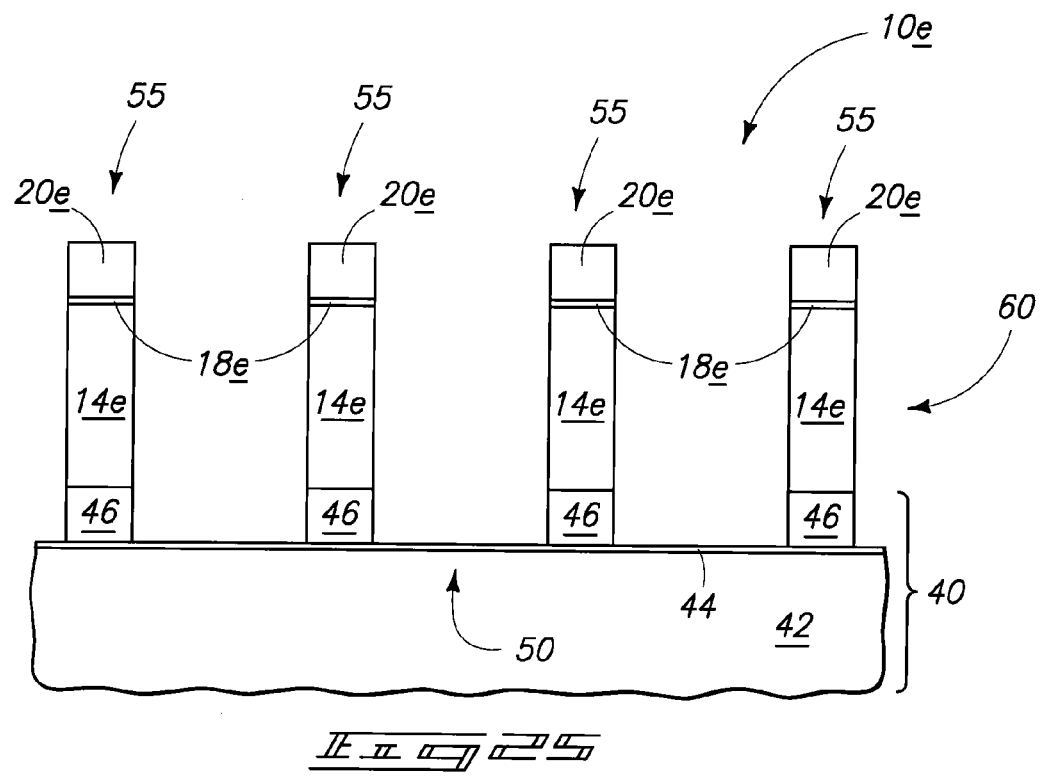
_FIG 25_
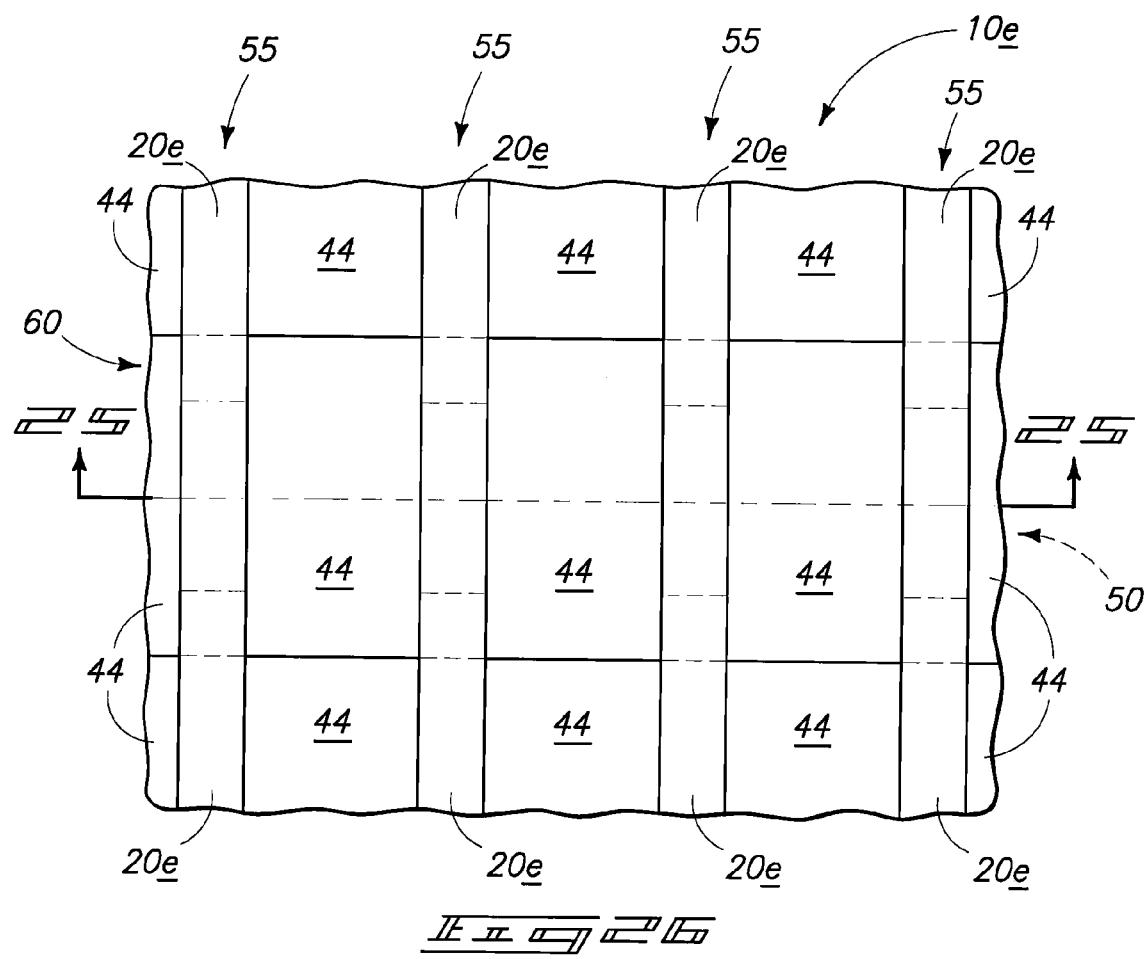
_FIG 26_

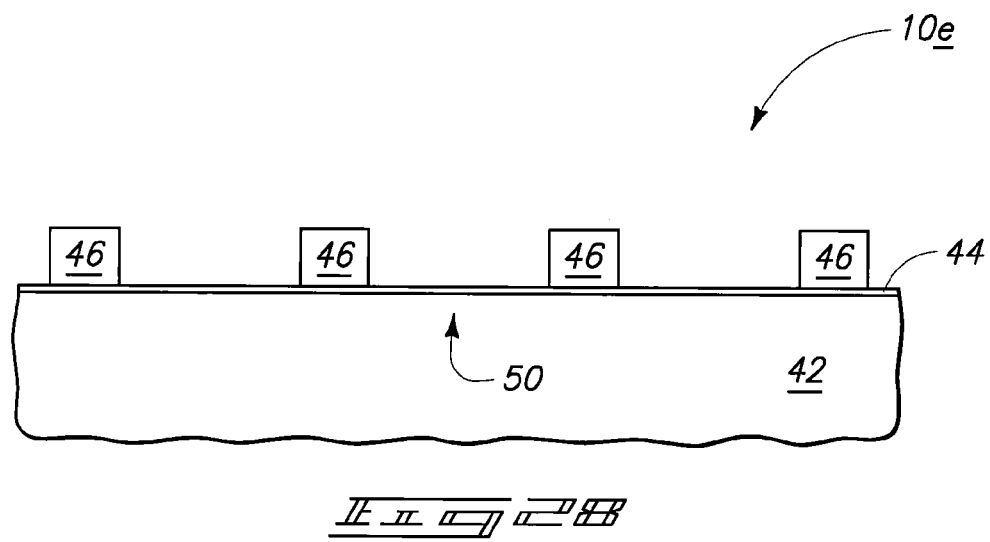
_FIG_ 28
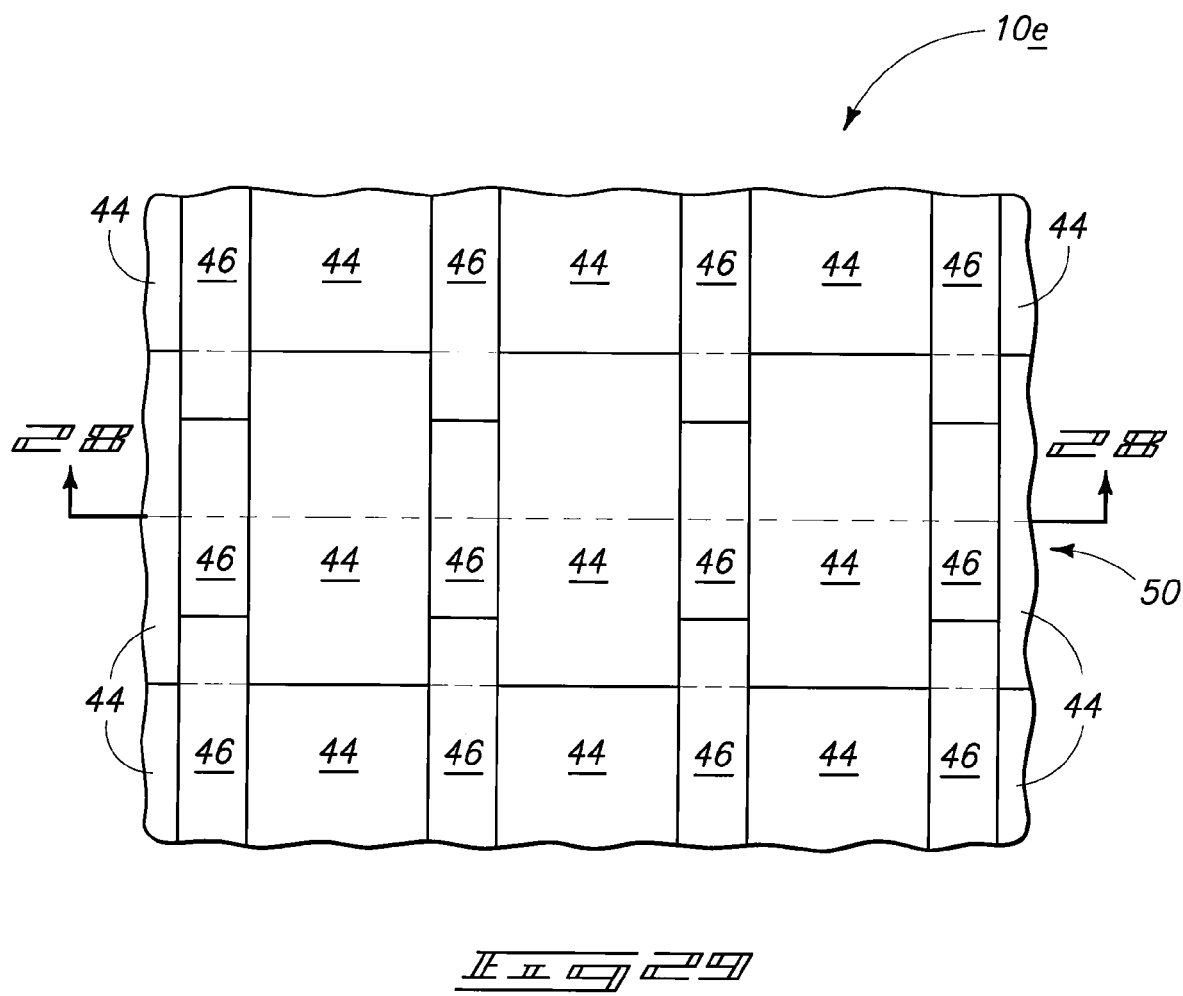
_FIG_ 29

METHODS OF FORMING A PHOTORESIST-COMPRISING PATTERN ON A SUBSTRATE

TECHNICAL FIELD

Embodiments disclosed herein pertain to methods of forming photoresist-comprising patterns on substrates.

BACKGROUND

Integrated circuits are typically formed on a semiconductor substrate such as a silicon wafer or other semiconducting material. In general, layers of various materials which are either semiconducting, conducting or insulating are utilized to form the integrated circuits. By way of example, the various materials are doped, ion implanted, deposited, etched, grown, etc. using various processes. A continuing goal in semiconductor processing is to continue to strive to reduce the size of individual electronic components thereby enabling smaller and denser integrated circuitry.

One technique for patterning and processing semiconductor substrates is photolithography. Such includes deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, thereby leaving a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresists and/or a combination of photoresists with non-radiation sensitive masking materials are utilized.

BRIEF DESCRIPTION OF THE DRAWINGS

FIG. 9 is a view of the FIG. 8 substrate at a processing subsequent to that shown by FIG. 8.

FIG. 10 is a top view of an alternate embodiment substrate to that shown by FIG. 7.

FIG. 14 is a diagrammatic isometric view of another alternate embodiment substrate in process in accordance with an embodiment of the invention.

FIG. 19 is a sectional view taken through line 19-19 in FIGS. 18 and 20.

FIG. 20 is a top view of FIG. 18.

FIG. 25 is a sectional view taken through line 25-25 in FIGS. 24 and 26.

FIG. 26 is a top view of FIG. 24.

FIG. 28 is a sectional view taken through line 28-28 in FIGS. 27 and 29.

FIG. 29 is a top view of FIG. 27.

DETAILED DESCRIPTION OF EXAMPLE EMBODIMENTS

Figure 1:
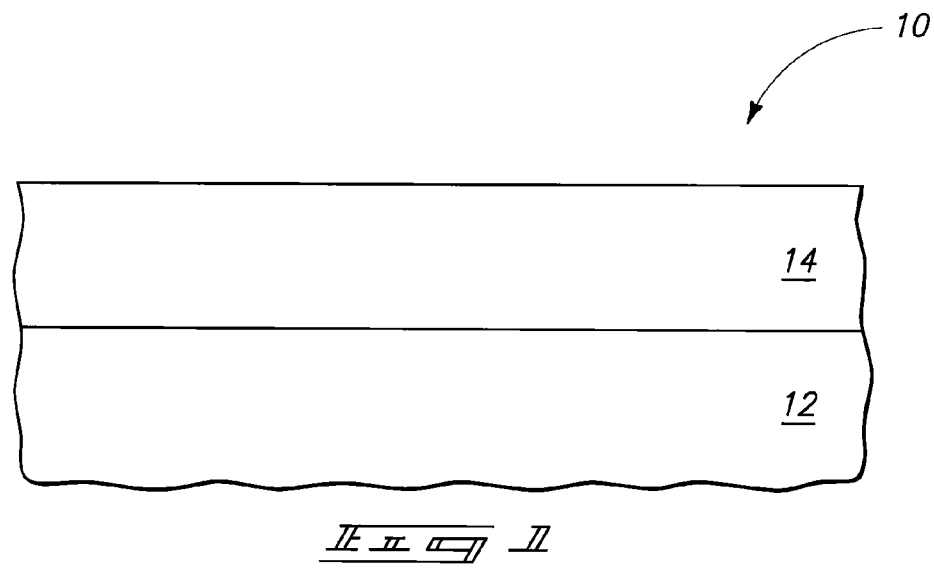
FIG. 1 is a diagrammatic sectional view of a substrate in process in accordance with an embodiment of the invention.

Example methods of forming a photoresist-comprising pattern on a substrate are initially described with reference to FIGS. 1-13. Referring to FIG. 1, a substrate, in one embodiment a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 is depicted as comprising substrate material 12 having a first photoresist 14 formed thereover. Substrate 12 might be homogenous or non-homogenous, and comprise multiple different composition regions and/or layers which will be processed in some manner using a photoresist-comprising pattern to be formed thereover. Such processing might, by way of example only, comprise etching, ion implantation, and/or gas diffusion or other treatment. Further, additional materials might be received intermediate substrate 12 and first photoresist 14, for example one or more antireflective coatings and/or hard masking layers.

Figure 2:
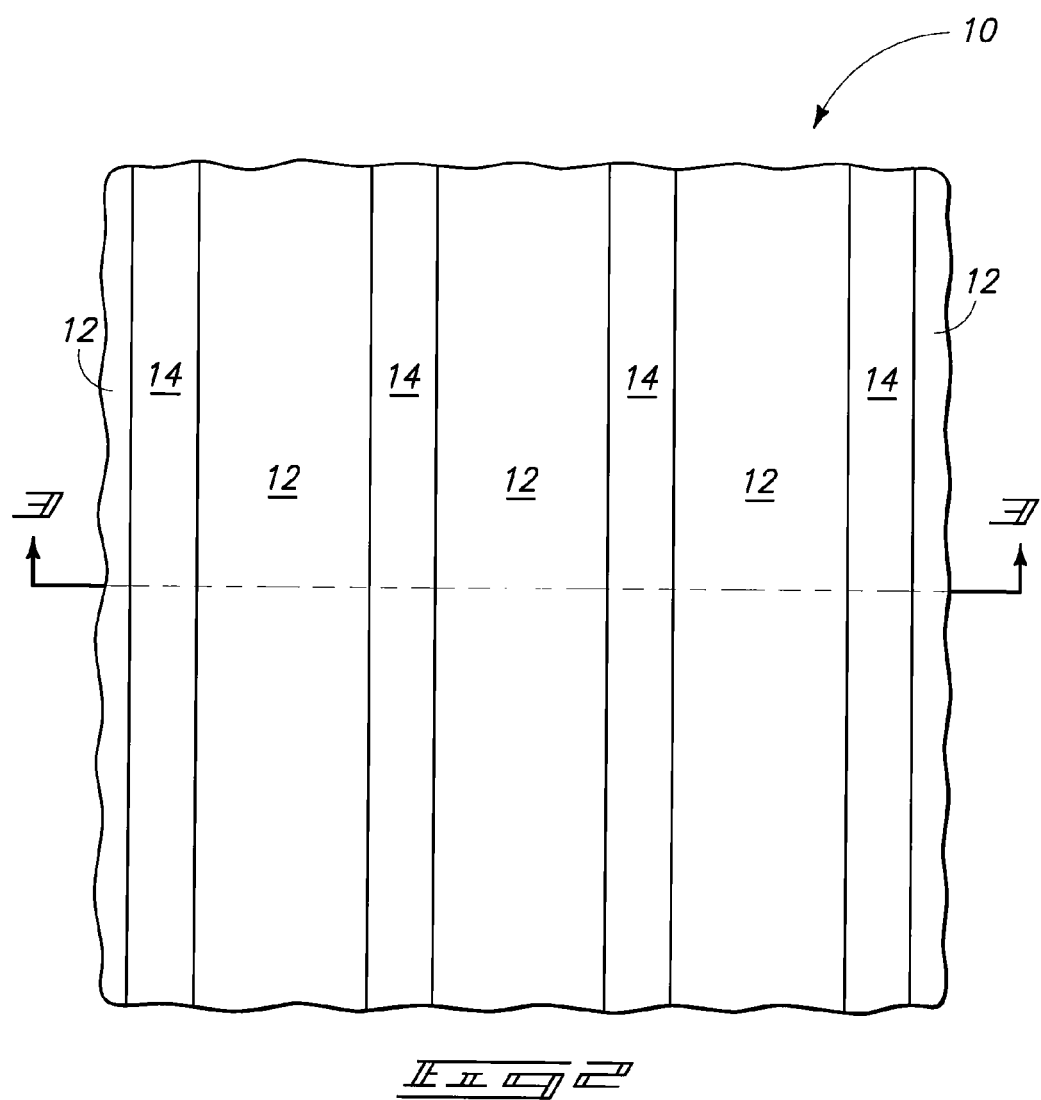
FIG. 2 is a top view of the FIG. 1 substrate at a processing subsequent to that shown by FIG. 1.
Figure 3:
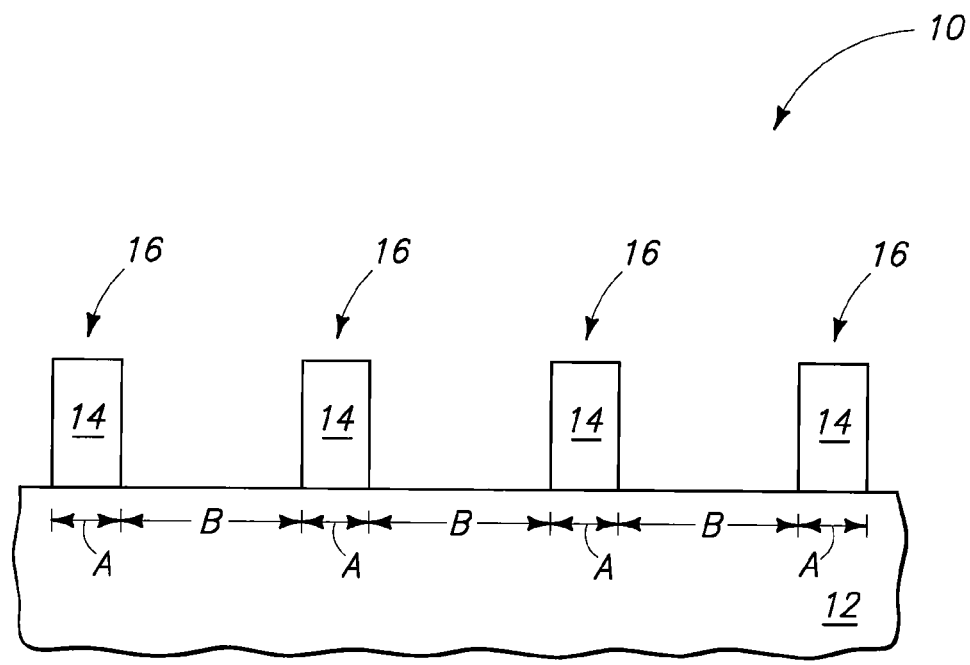
FIG. 3 is a sectional view taken through line 3-3 in FIG. 2.

Referring to FIGS. 2 and 3, first photoresist 14 has been patterned to form spaced first masking shields 16 in at least one cross section (meaning in a straight line), for example the cross section depicted by FIG. 3. In the illustrated example, such are shown as comprising elongated lines, although any alternate mask pattern is contemplated. For example, a series of enclosed openings might be alternately or additionally patterned relative to the first photoresist. For purposes of the continuing discussion, spaced first masking shields 16 can be considered as having lateral dimensions A and spacings B between adjacent of first masking shields 16 in the one cross section. Some, none, or all of the lateral dimensions may be equal to one another. Further, some, none, or all of the spacings between adjacent of the first masking shields may be equal to one another. As well, some, none, or all of such spacings and dimensions may be equal to one another.

Figure 4:
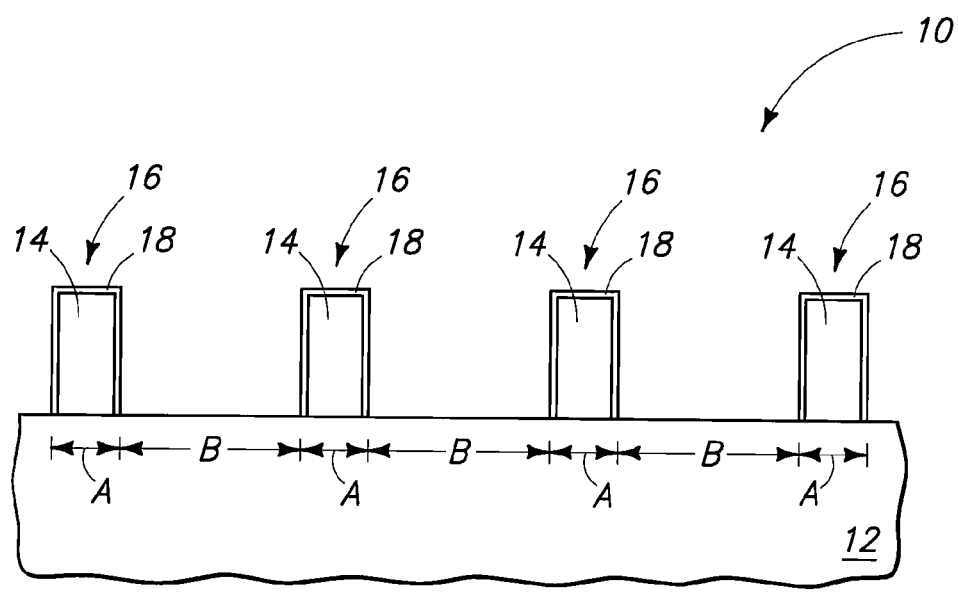
FIG. 4 is a view of the FIG. 3 substrate at a processing subsequent to that shown by FIG. 3.

Referring to FIG. 4, first masking shields 16 have been exposed to a fluorine-containing plasma effective to form a hydrogen and fluorine-containing organic polymer coating 18 about outermost surfaces of first masking shields 16. Such a coating may be deposited as a layer over masking shields 16, and/or result from transformation of the outer material of shields 16 to form coating 18 independent of adding thickness to shields 16. Regardless, the fluorine-containing plasma might be generated either one or both of within a chamber within which substrate 10 is received and remote of a chamber within which substrate 10 is received. If plasma generation occurs within a chamber in which the substrate is received, such might by way of example include an inductively coupled plasma generating reactor or a capacitively coupled plasma generating reactor. Other existing or yet-to-be-developed plasma systems may also be used. Example gases which may be used for forming the fluorine-containing plasma include at least one of a fluorocarbon (i.e., $CF_4$, $C_4F_6$, $C_4F_8$), a hydrofluorocarbon (i.e., $CH_2F_2$, $CHF_3$), and $NF_3$, including any mixtures thereof. Inert gases may also be added. In an inductively coupled reactor, example parameters include pressure from about 1 mTorr to about 20 mTorr, substrate temperature from about 0° C. to about 110° C., source power from about 150 watts to about 800 watts, and bias voltage less than or equal to about 50 volts. An example total flow rate for the fluorine-containing gas into the reactor is from about 20 sccm to about 150 sccm. In a more specific example, $CF_4$ and $CH_2F_2$ are both flowed into the reactor, for example $CF_4$ from about 20 sccm to about 120 sccm and $CH_2F_2$ from about 5 sccm to about 25 sccm. $O_2$ may or may not also be used with the gases to form the fluorine-containing plasma. An example $O_2$ flow rate is from 0 sccm to about 10 sccm.

Figure 5:
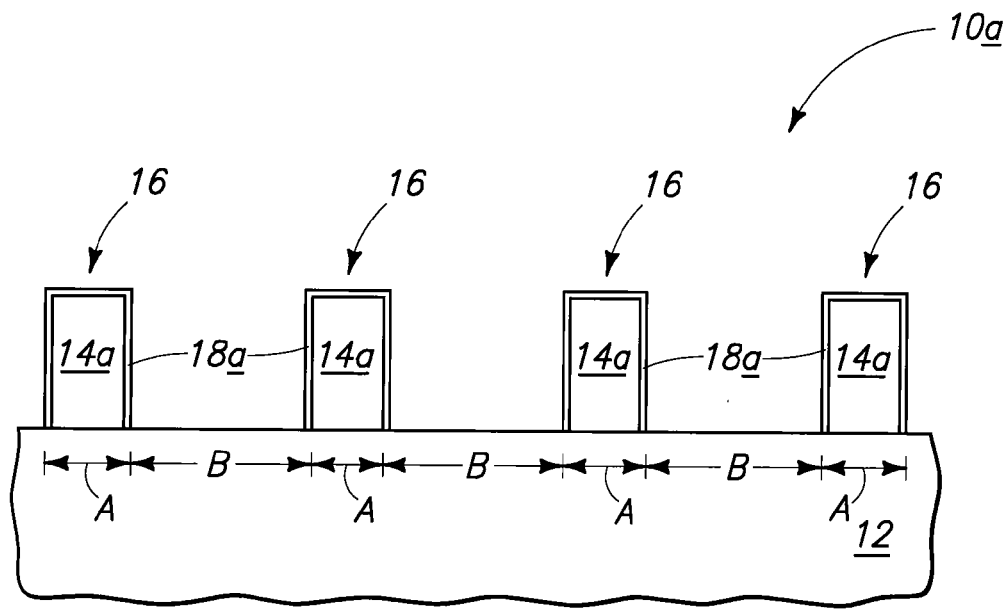
FIG. 5 is a view of an alternate embodiment substrate to that shown by FIG. 4.

Exposure to the fluorine-containing plasma may or may not change the lateral dimensions of first masking shields 16 in the one cross section and may or may not change the spacings between adjacent of first masking shields 16 in the one cross section. FIG. 4 depicts an embodiment wherein the exposing has not changed either dimensions A or spacings B. FIG. 5 depicts an alternate embodiment substrate 10a to that shown in FIG. 4. Like numerals from the first-described embodiment have been utilized, with differences being indicated with the suffix "a". In FIG. 5, the exposure of the first masking shields to a fluorine-containing plasma has changed dimensions A and spacings B by increasing of dimensions A and decreasing of spacings B. By way of example only in the above example process, pressure at the higher end of the stated 1 mTorr to 20 mTorr range in combination with flowing $CH_2F_2$ at the higher end of the stated 5 sccm to 25 sccm range would tend to increase dimensions A and reduce spacings B.

Figure 6:
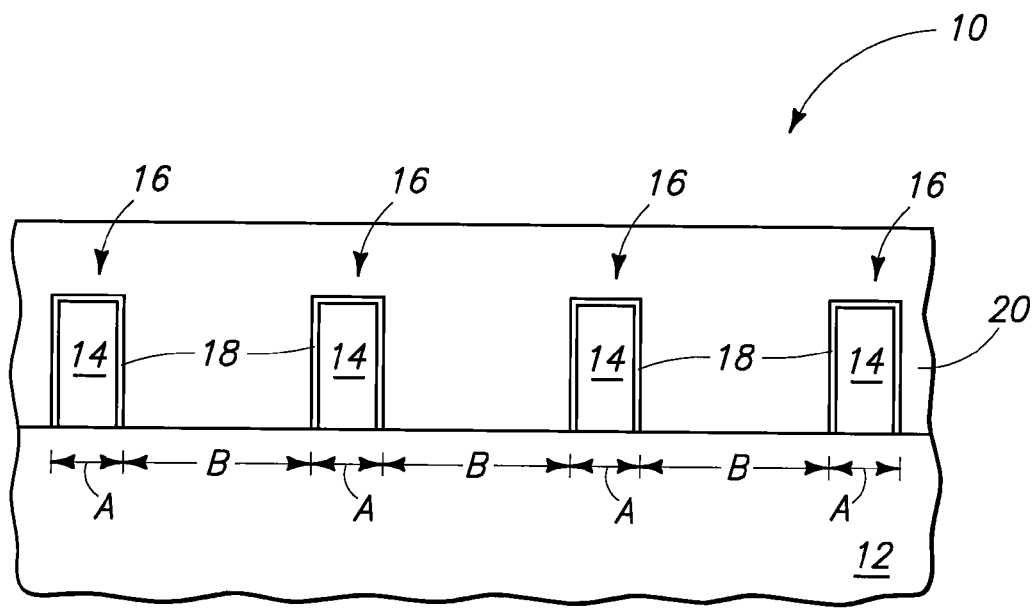
FIG. 6 is a view of the FIG. 4 substrate at a processing subsequent to that shown by FIG. 4.

Referring to FIG. 6, a second photoresist 20 is deposited over and in direct physical touching contact with hydrogen and fluorine-containing organic polymer coating 18 received about first masking shields 16. First photoresist 14 and second photoresist 20 may be of the same or different composition. Further, first photoresist 14 and second photoresist 20 may be of the same or different type regarding positive and negative. In other words, both of first photoresist 16 and second photoresist 20 could be negative, both could be positive, or one could be positive and the other negative. The substrate between the time of forming first masking shields 16 with hydrogen and fluorine-containing organic polymer coating 18 and deposition of second photoresist 20 need not be exposed to any baking or exposed to any liquid. In one embodiment, the substrate is void of any exposure to baking, and in one embodiment void of any exposure to liquid (other than the second photoresist), between the formation of coating 18 and the deposition of second photoresist 20.

Figure 7:
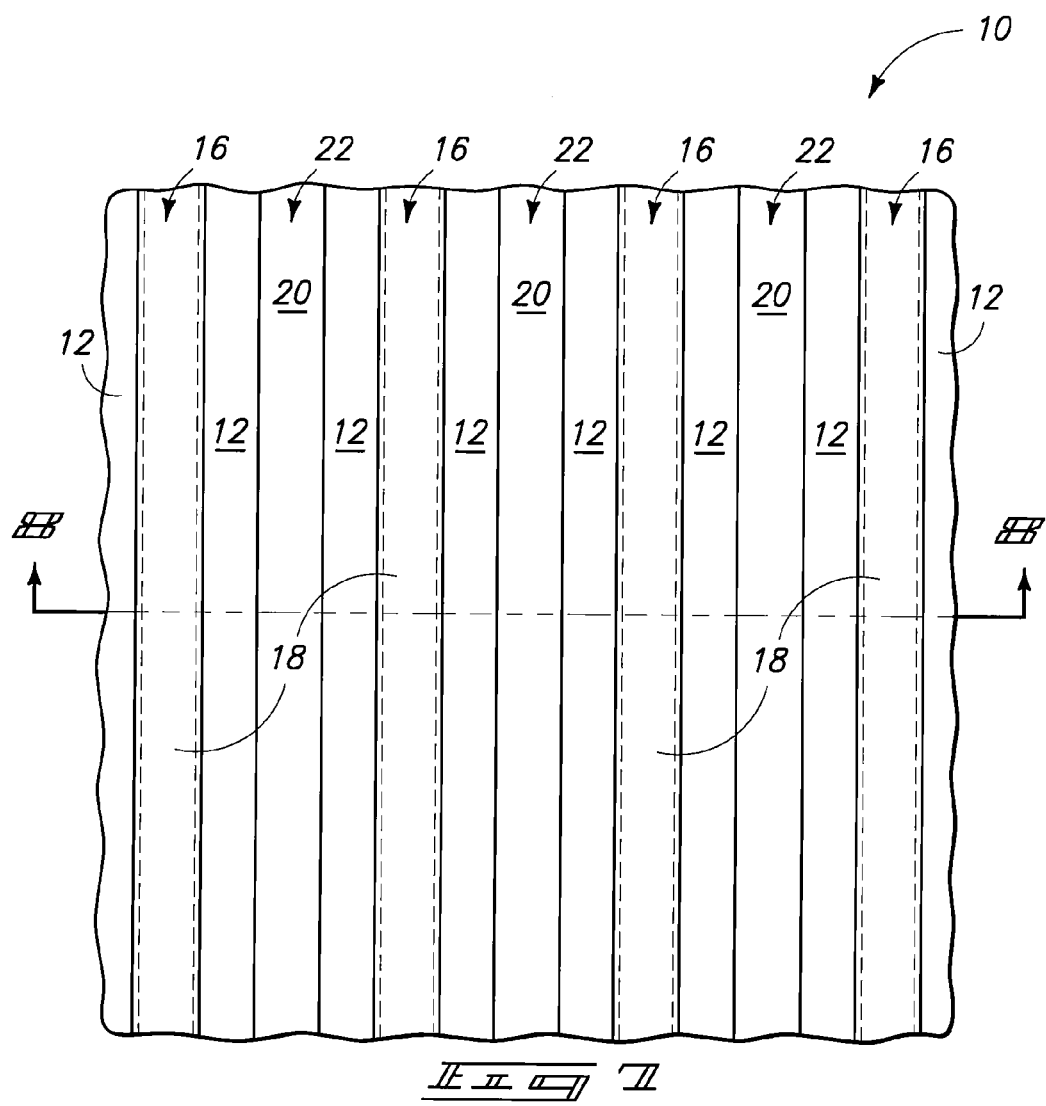
FIG. 7 is a top view of the FIG. 6 substrate at a processing subsequent to that shown by FIG. 6.
Figure 8:
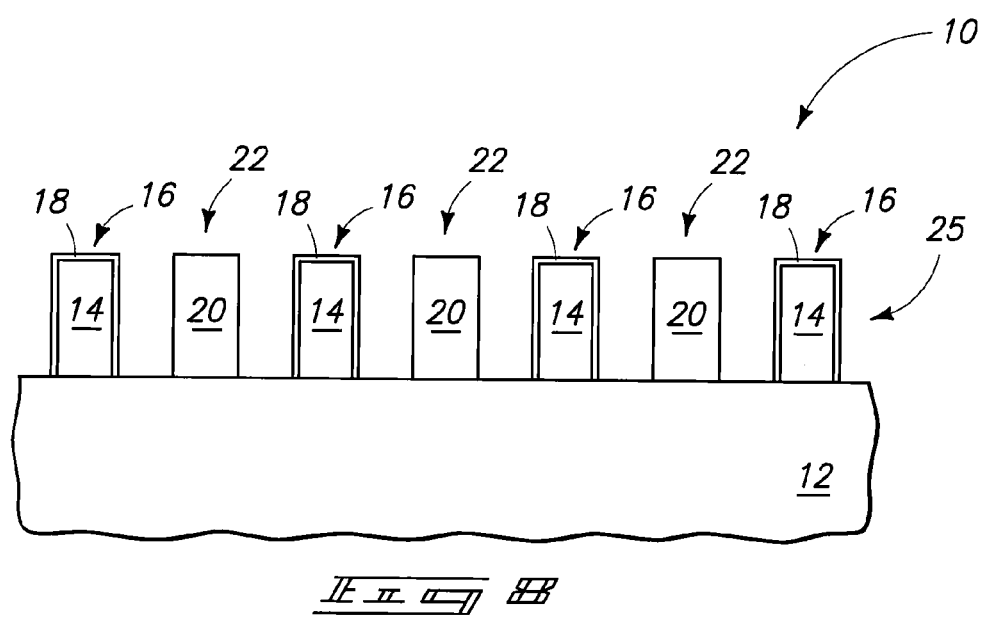
FIG. 8 is a sectional view taken through line 8-8 in FIG. 7.

Referring to FIGS. 7 and 8, second photoresist 20 has been exposed to a pattern of actinic energy and thereafter processed to form spaced second masking shields 22 in the one cross section which comprise second photoresist 20 and correspond to the actinic energy pattern. First and second masking shields 16 and 22 together comprise a photoresist-comprising pattern 25 on substrate 10, and which may be used for processing substrate material there-below. Example processing to produce the FIGS. 3 and 8 patterns, by way of examples only, includes exposure to actinic energy through suitable masks/reticles, followed by subsequent solvent processing. For example, a suitable photopatterned layer of photoresist can be exposed to suitable developers (i.e., tetramethylammonium hydroxide [TMAH]) and rinsing solutions (i.e., propylene glycol monomethyl ether acetate [PGMEA] and/or propylene glycol monomethyl ether [PGME]) to produce the FIG. 3 and the FIG. 8 constructions. Exposure to the fluorine-containing plasma to produce coating 18 protects or freezes underlying photoresist to chemical or physical attack upon subsequent exposure to such, and other, example developers and rinse materials. Thereby, the patterning of second photoresist 20 deposited in FIG. 6 to produce the construction of FIGS. 8 and 9 may be conducted without appreciably changing first masking shields 16, as is depicted in FIGS. 7 and 8.

Substrate material 12 beneath photoresist-comprising pattern 25 may be subsequently processed, for example and by way of example only by etching or ion implantation. FIG. 9 depicts one embodiment wherein photoresist-comprising mask pattern 25 has been used as an etch mask while etching into material of substrate 12 which is received elevationally inward of first photoresist 14. In one embodiment, such processing is void of etching any substrate material received elevationally inward of first photoresist 14 between the time of forming coated first masking shields 16 of FIG. 4 and the forming of second masking shields 22 of FIGS. 7 and 8.

FIGS. 7 and 8 depict an embodiment wherein the second masking shields are spaced from the first masking shields in the one cross section. Alternate embodiments are of course contemplated. For example, FIG. 10 depicts in top view an alternate embodiment substrate 10b to that shown by FIG. 7. Like numerals from the first-described embodiment have been utilized where appropriate, with differences being indicated with the suffix "b" or with different numerals. In FIG. 10, second masking shields 22b, by way of example only, have been formed orthogonal relative to first masking shields 16. Masking shields 16 and 22b may be considered as having been formed relative to and in any common one cross section, for example a cross section depicted by line 23 in FIG. 10.

Figure 11:
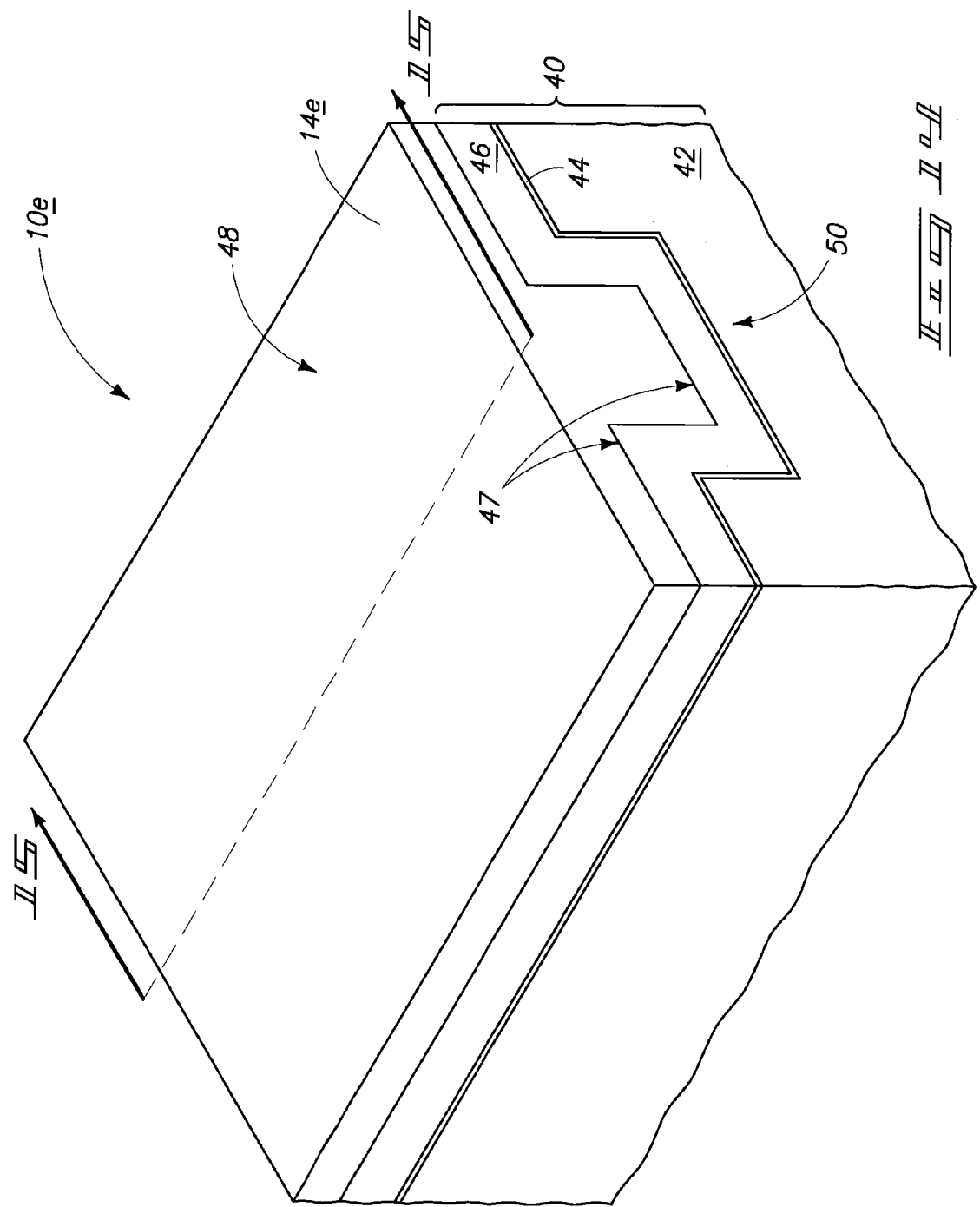
FIG. 11 is a top view of another alternate embodiment substrate to those of FIGS. 7 and 10.

FIG. 10 provides but one example wherein a portion of the second masking shields are received elevationally atop the first masking shields in the one cross section. Alternate such configurations are also contemplated. For example, FIG. 11 illustrates another alternate embodiment substrate 10c. Like numerals from the above-described embodiments have been utilized where appropriate, with differences being indicated with the suffix "c" or with different numerals. FIG. 11 depicts a patterned first photoresist 14c having spaced first masking shields 16c in at least one cross section (i.e., a cross section 31) to form the depicted openings 27. Second photoresist 20c has been patterned to form spaced second masking shields 22c in the one cross section to form circular openings 28 which overlap with openings 27 in first photoresist 14c. Thereby, intersecting/overlapping areas 29 of the respective circles 27 and 28 define a photoresist-comprising pattern on the substrate through which material beneath first photoresist 14c can be processed.

Figure 12:
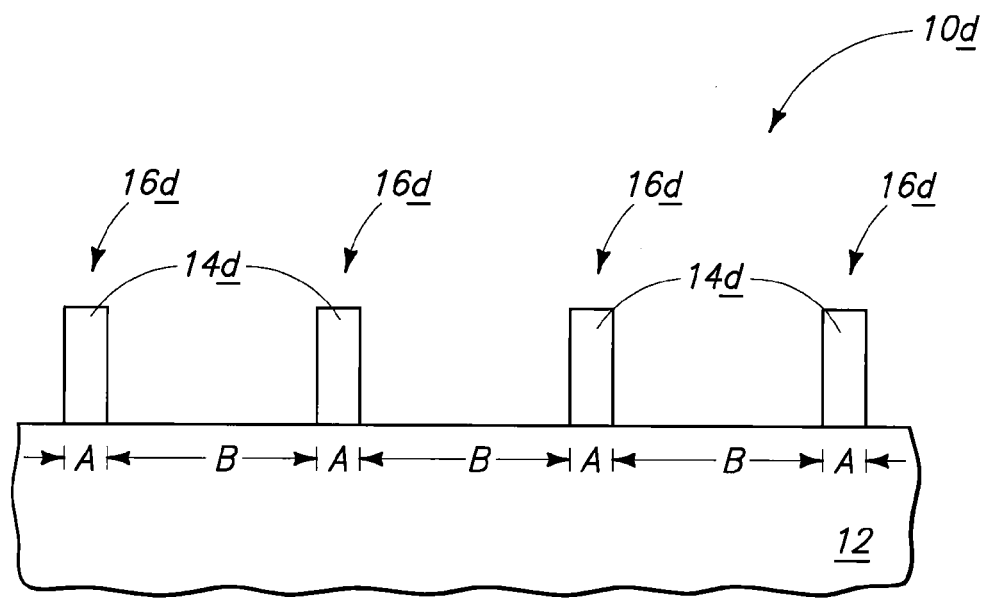
FIG. 12 is a view of another alternate embodiment substrate at a processing subsequent to that shown by FIG. 3.

Additional embodiments of methods of forming a photoresist-comprising pattern on a substrate are next described with reference to FIGS. 12 and 13. FIG. 12 depicts an alternate embodiment substrate fragment 10d formed as a result of alternate processing of the FIG. 3 substrate in comparison to that shown by FIG. 4. Like numerals from the first-described embodiments are utilized where appropriate, with differences being indicated with the suffix "d". In FIG. 12, the substrate of FIG. 3 has been placed within a suitable chamber, and first photoresist 14d of first masking shields 16d have been etched to reduce their respective widths A in the same depicted cross section of FIG. 3. In one embodiment, such etching comprises plasma etching. Regardless, FIG. 12 shows an embodiment wherein the etching also reduces elevation of first masking shields 16d above substrate material 12, and also one embodiment where the etching reduces more width than elevation of the first masking shields 16d.

By way of example only, the FIG. 12 construction can be derived by plasma etching within an inductively coupled reactor. Example etching parameters which will achieve essentially isotropic etching of patterned first photoresist 14 (meaning equal removal from the tops and each of the sides of the depicted first photoresist) is pressure from about 2 mTorr to about 50 mTorr, substrate temperature from about 0° C. to about 110° C., source power from about 150 watts to about 500 watts, and bias voltage at less than or equal to about 25 volts. In one embodiment, the etching comprises injecting an etching gas into the chamber, with an example etching gas being a combination of $Cl_2$ from about 20 sccm to about 100 sccm and $O_2$ from about 10 sccm to about 50 sccm. Such will isotropically etch first photoresist 14 at a rate from about 0.2 nanometers per second to about 3 nanometers per second, resulting in the example 14d/16d construction. While such an example etch is essentially isotropic, greater lateral etching of first photoresist 14 in FIG. 12 has occurred as two sides of photoresist are laterally exposed as compared to only a single upper surface.

If even more lateral etching is desired in comparison to vertical etching, example parameter ranges in an inductively coupled reactor include pressure from about 2 mTorr to about 20 mTorr, source power from about 150 watts to about 500 watts, bias voltage at less or equal to about 25 volts, substrate temperature of from about 0° C. to about 110° C., $Cl_2$ and/or HBr flow from about 20 sccm to about 100 sccm, $O_2$ flow from about 5 sccm to about 20 sccm, and $CF_4$ flow from about 80 sccm to about 120 sccm. Such can be used to etch a substantially horizontal surface at a greater rate than a substantially vertical or slanted surface.

It might be desired that the stated etching provide greater removal from the top of the depicted first photoresist masking shields than from the sides, for example to either achieve equal elevation and width reduction or more elevation than width reduction. Example parameters for achieving greater etch rate in the vertical direction as opposed to the lateral direction includes pressure from about 2 mTorr to about 20 mTorr, temperature from about 0° C. to about 110° C., source power from about 150 watts to about 300 watts, bias voltage at greater than or equal to about 200 volts, $Cl_2$ and/or HBr flow from about 20 sccm to about 100 sccm, and $O_2$ flow from about 10 sccm to about 20 sccm.

Figure 13:
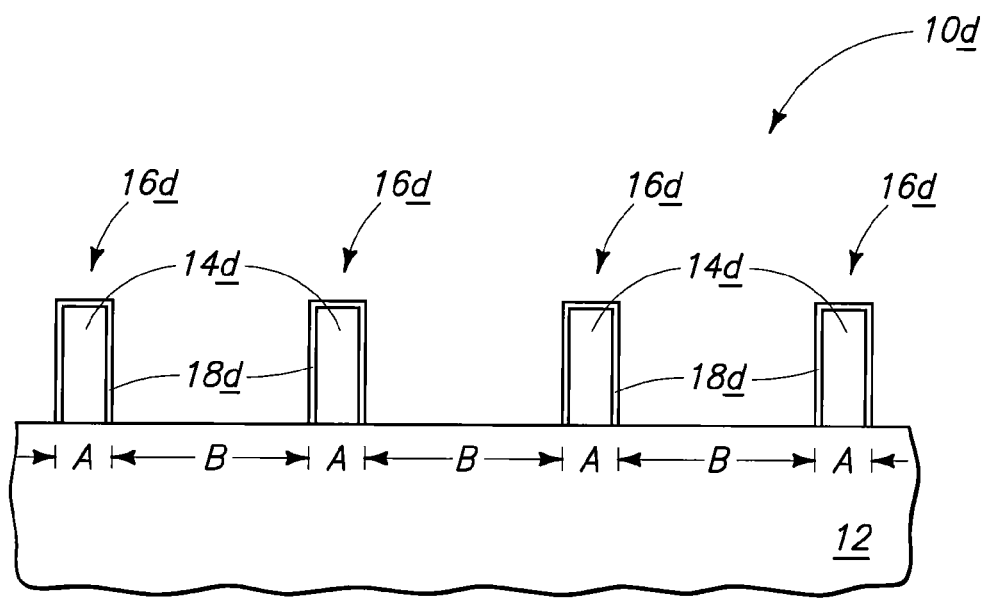
FIG. 13 is a view of the FIG. 12 substrate at a processing subsequent to that shown by FIG. 12.

Referring to FIG. 13, the substrate of FIG. 12 with spaced masking shields 16d has been exposed to a fluorine-containing plasma effective to form a hydrogen and fluorine-containing organic polymer coating 18d about outermost surfaces of the reduced-width first masking shields. Such occurs within the very same chamber that the etching of FIG. 12 occurred and after such etching. Accordingly and in one embodiment, such is conducted in situ with the substrate not being removed from the chamber between the time of the FIG. 12 etching and the time of the exposing to the fluorine-containing plasma. Any of the processing described above with respect to fluorine-containing plasma exposure can be conducted to produce the example FIG. 13 embodiment. Accordingly, such plasma might be generated within the chamber or remote from the chamber. In some embodiments, the exposing comprises injecting a fluorine-containing gas other than the etching gas into the chamber. In one such embodiment, injecting of the etching gas may be ceased prior to initiating the injecting of the fluorine-containing gas, and in another embodiment the injecting of the etching gas is not ceased prior to initiating injecting of the fluorine-containing gas. For examples and by way of examples only, the etching gas might continue to be fed into the chamber upon and during flow of the fluorine-containing gas, with such continued flow of the etching gas being below, at, or above the flow rate of such etching gas during the act of etching.

A second photoresist (not shown) would be deposited over the hydrogen and fluorine-containing organic polymer coating 18d received about first masking shields 16d. In one embodiment, the second photoresist is deposited in direct physical touching contact with the hydrogen and fluorine-containing organic polymer coating which is received about first masking shields 16d, for example analogous to the processing depicted by FIG. 6. The second photoresist would then be patterned to form spaced second masking shields which comprise the second photoresist, with the first and second masking shields together comprising a photoresist-comprising pattern on the substrate. Accordingly, processing as described above in such regard may be conducted.

Processing as described above whereby the first masking shields are first subjected to etching action to at least reduce their respective widths and then exposed to a fluorine-containing plasma to form the coating may enable better control of width reduction and thereby ultimately critical dimension or width of the masking shields and spaces therebetween than prior art processing methods. However, some embodiments of the invention also encompass exposing the example first masking shields of any of the above embodiments to a plasma which simultaneously comprises a reactive component which modifies respective widths of the first masking shields in the one cross section and a fluorine-containing component other than the reactive component which forms a hydrogen and fluorine-containing organic polymer coating about outermost surfaces of the modified-width first masking shields. Exposure to such plasma may reduce the respective widths of the first masking shields in the one cross section or increase the respective widths of the first masking shields and the one cross section. An example such reactive component for reducing the respective widths may be derived from $O_2$ and at least one of $Cl_2$ and HBr, including mixtures thereof. An example such reactive component for increasing the respective widths may be derived from $C_2H_4$. Example fluorine-containing components are those described above, and provided in sufficient quantity in combination with other operating parameters to achieve the stated act of forming the hydrogen and fluorine-containing organic polymer coating. Example parameter ranges for such include any of those as described above.

A second photoresist is then deposited over the hydrogen and fluorine-containing organic polymer coating which is received about the first masking shields, for example as described above. In one embodiment, the second photoresist is deposited in direct physical touching contact with the hydrogen and fluorine-containing organic polymer coating received about the first masking shields. By way of examples only, any of the above depicted and described embodiments may be fabricated by exposure of the first spaced masking shields to a plasma comprising both the stated reactive component which modifies width and the fluorine-containing component which forms the polymer coating.

Figure 15:
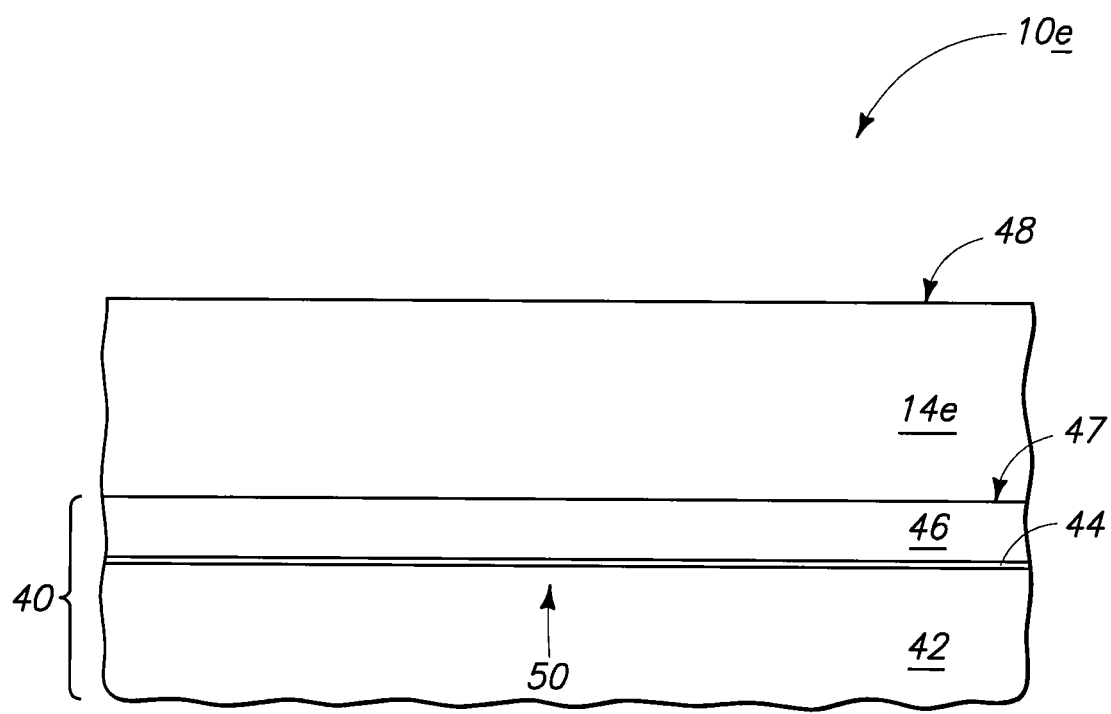
FIG. 15 is a sectional view taken through line 15-15 in FIG. 14.

Additional embodiment methods of forming a photoresist-comprising pattern on a substrate are described with reference to FIGS. 14-29 with respect to a substrate 10e. Like numerals from the above-described embodiments have been utilized where appropriate, with differences being indicated with the suffix "e" or with different numerals. FIGS. 14 and 15 depict a substrate 40 having first photoresist 14e formed thereover. Example substrate 40 comprises substrate material 42, an etch stop layer 44 formed thereover, and a material-to-be-etched 46 received over etch stop layer 44. In one example, material 46 might be conductive material, including conductively doped semiconductive material, from which conductive lines or interconnects will be formed. First photoresist 14e may be as described in any of the above embodiments with respect to first photoresist 14's. Further, one or more antireflective coating layers and/or hard masking layers (not shown) might be received between first photoresist 14e and substrate 40. Substrate 42 comprises any underlying substrate material analogous to that of substrate 12 in the above-described embodiments. For purposes of the continuing discussion, first photoresist 14e in one embodiment comprises a planar elevationally outermost surface 48. In one embodiment, and as shown, substrate 40 has a non-planar elevationally outermost surface 47 immediately prior to formation of first photoresist 40 thereover, with such being exemplified by the depicted trench 50 in substrate 40.

Figure 16:
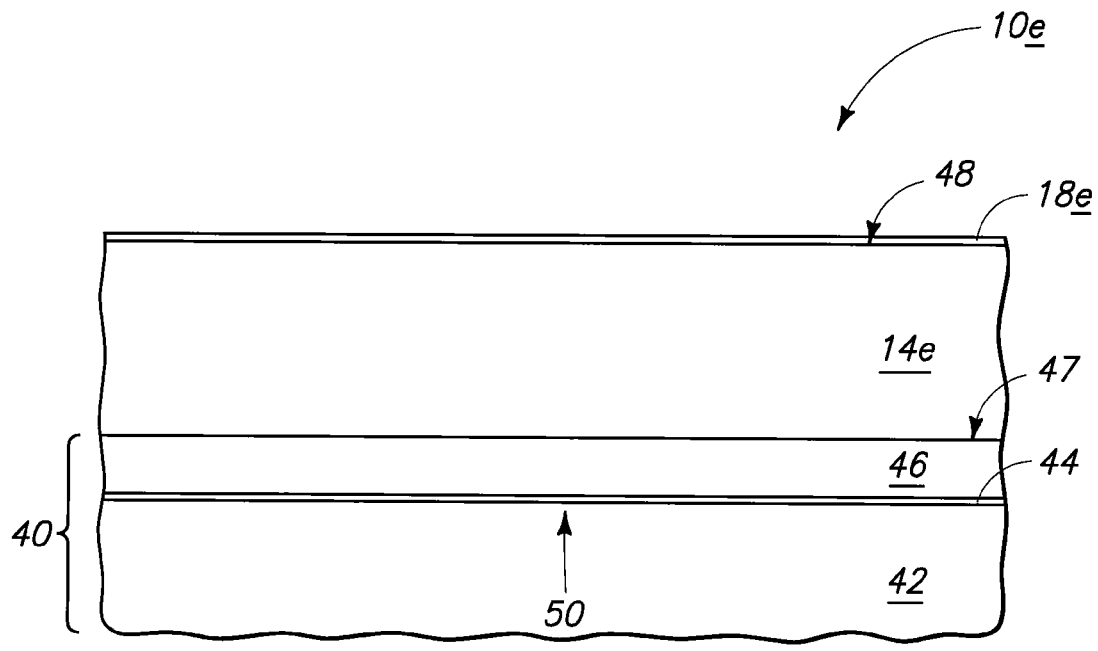
FIG. 16 is a view of the FIG. 15 substrate at a processing subsequent to that shown by FIG. 15.

Referring to FIG. 16, first photoresist 14e has been exposed to a fluorine-containing plasma effective to form a hydrogen and fluorine-containing organic polymer coating 18e on planar elevationally outermost surface 48. Example exposings to a fluorine-containing plasma to form such coating 18e include any of those described above in the formation of coating 18's.

Figure 17:
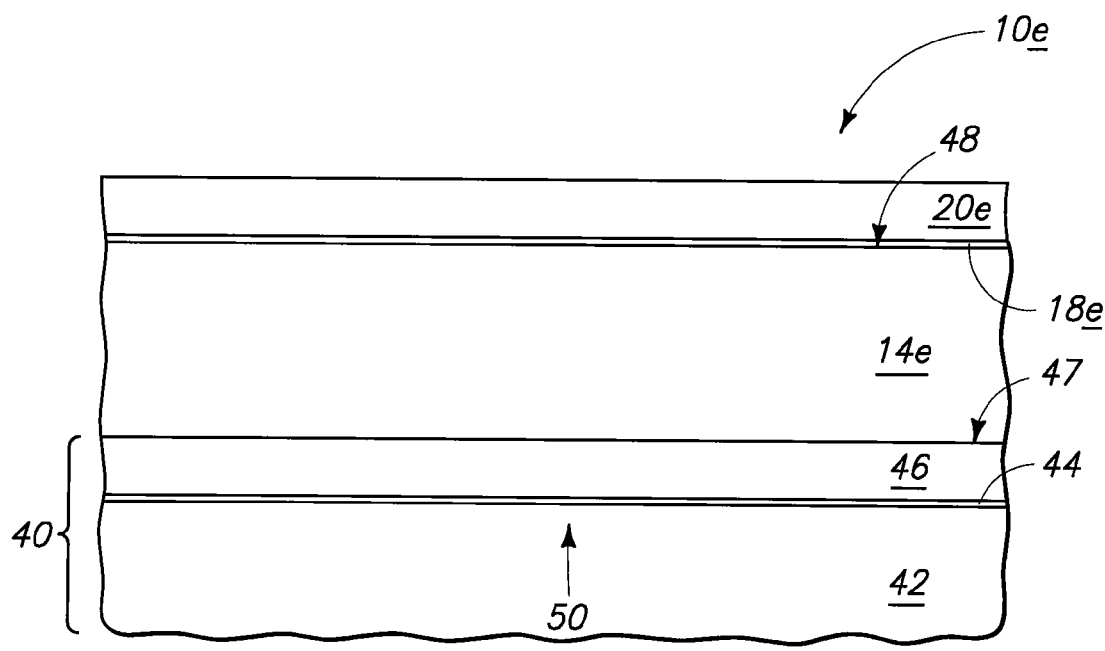
FIG. 17 is a view of the FIG. 16 substrate at a processing subsequent to that shown by FIG. 16.

Referring to FIG. 17, a second photoresist 20e is deposited over and in direct physical touching contact with hydrogen and fluorine-containing organic polymer coating 18e which is received on planar elevationally outermost surface 48 of first photoresist 14e. Example second photoresist 20e includes any of those described above with respect to photoresist 20's.

Figure 18:
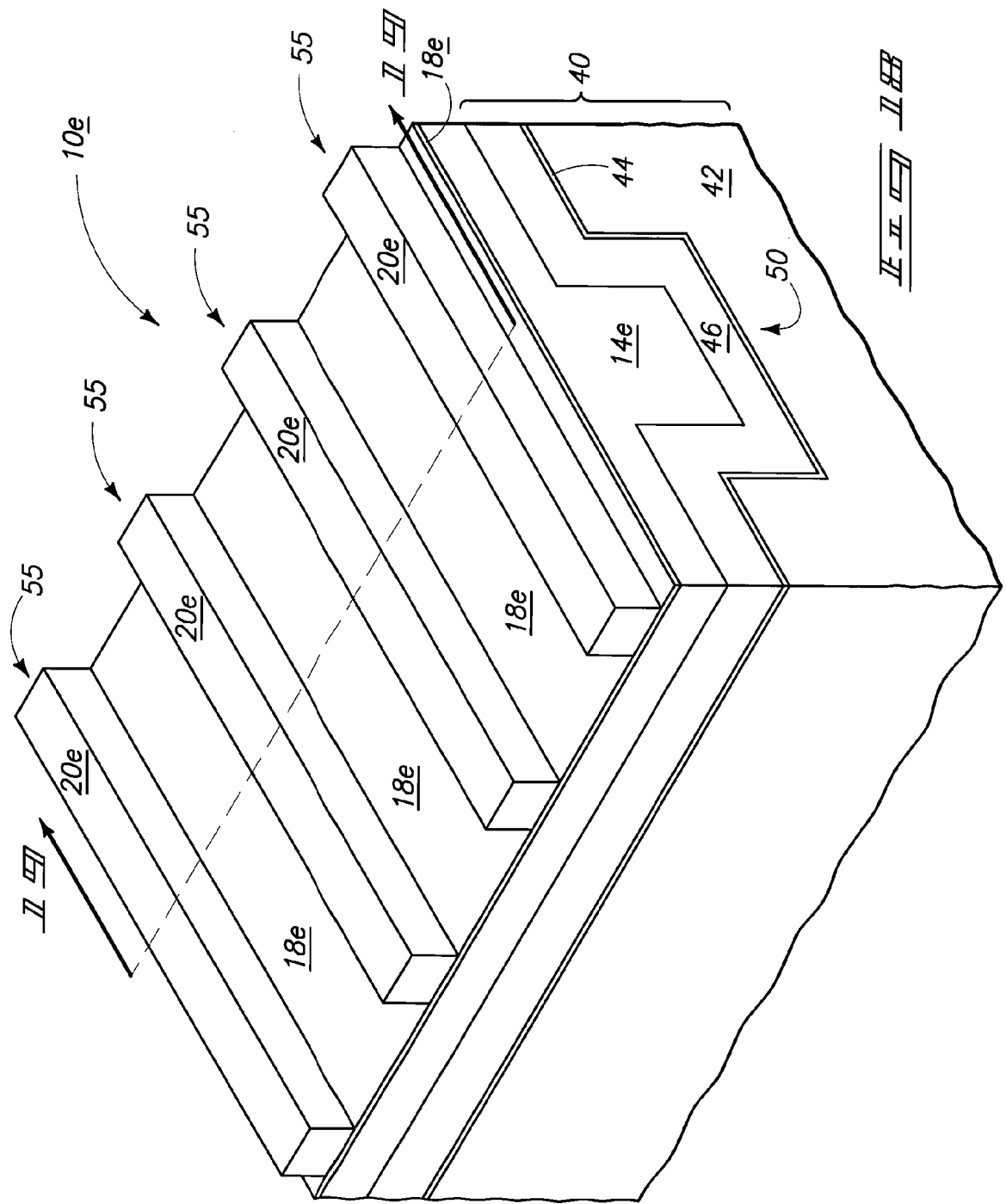
FIG. 18 is a diagrammatic isometric view of the FIG. 17 substrate at a processing subsequent to that shown by FIG. 17.

Referring to FIGS. 18-20, second photoresist 20e has been patterned to form spaced masking shields 55 in at least one cross section (i.e., the cross section in which FIG. 19 lies) which comprise second photoresist 20e. Such processing has been conducted to stop on hydrogen and fluorine-containing organic polymer coating 18e. Example techniques for doing so include exposure to TMAH as a developer, combined with rinsing before or after with one or both of PGMEA or PGME. Hydrogen and fluorine-containing organic polymer coating 18e effectively shields underlying material from being etched, and thereby serves in an etch stopping function/capacity.

Figure 21:
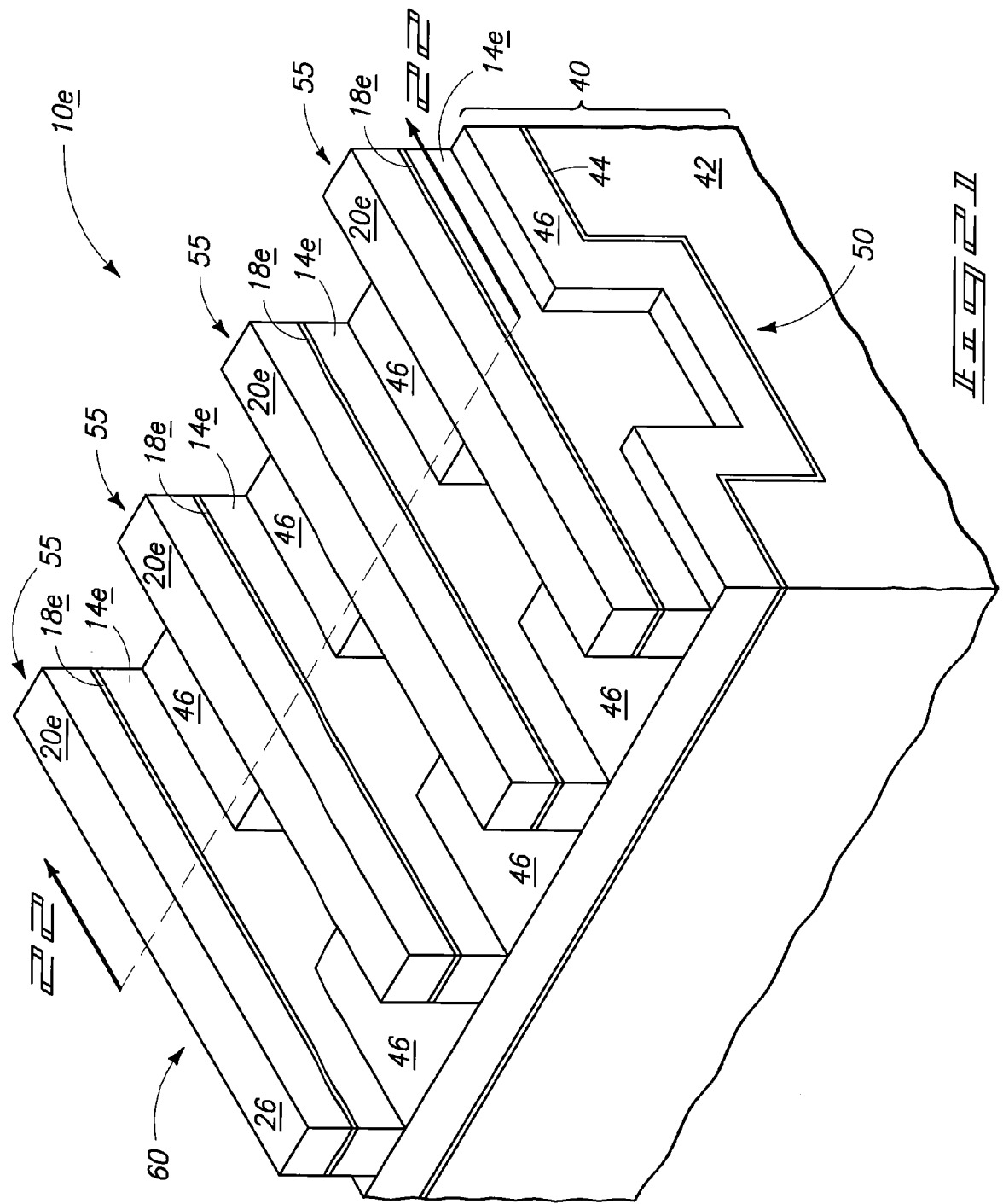
FIG. 21 is a view of the FIG. 18 substrate at a processing subsequent to that shown by FIG. 18.
Figure 22:
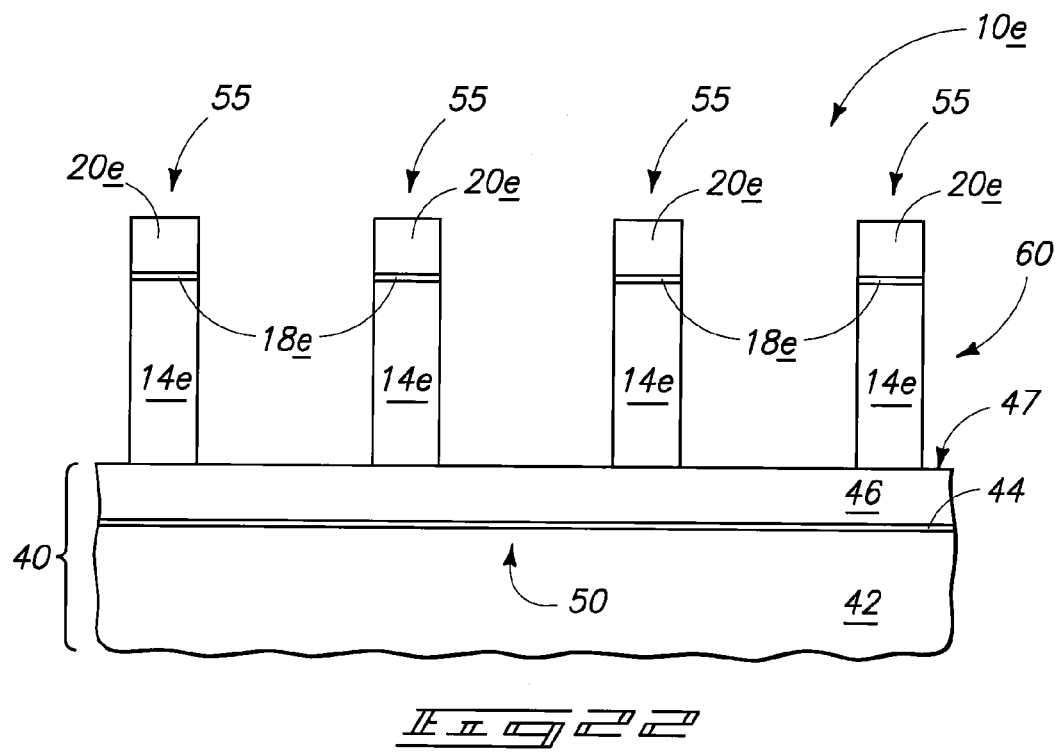
FIG. 22 is a sectional view taken through line 22-22 in FIGS. 21 and 23.
Figure 23:
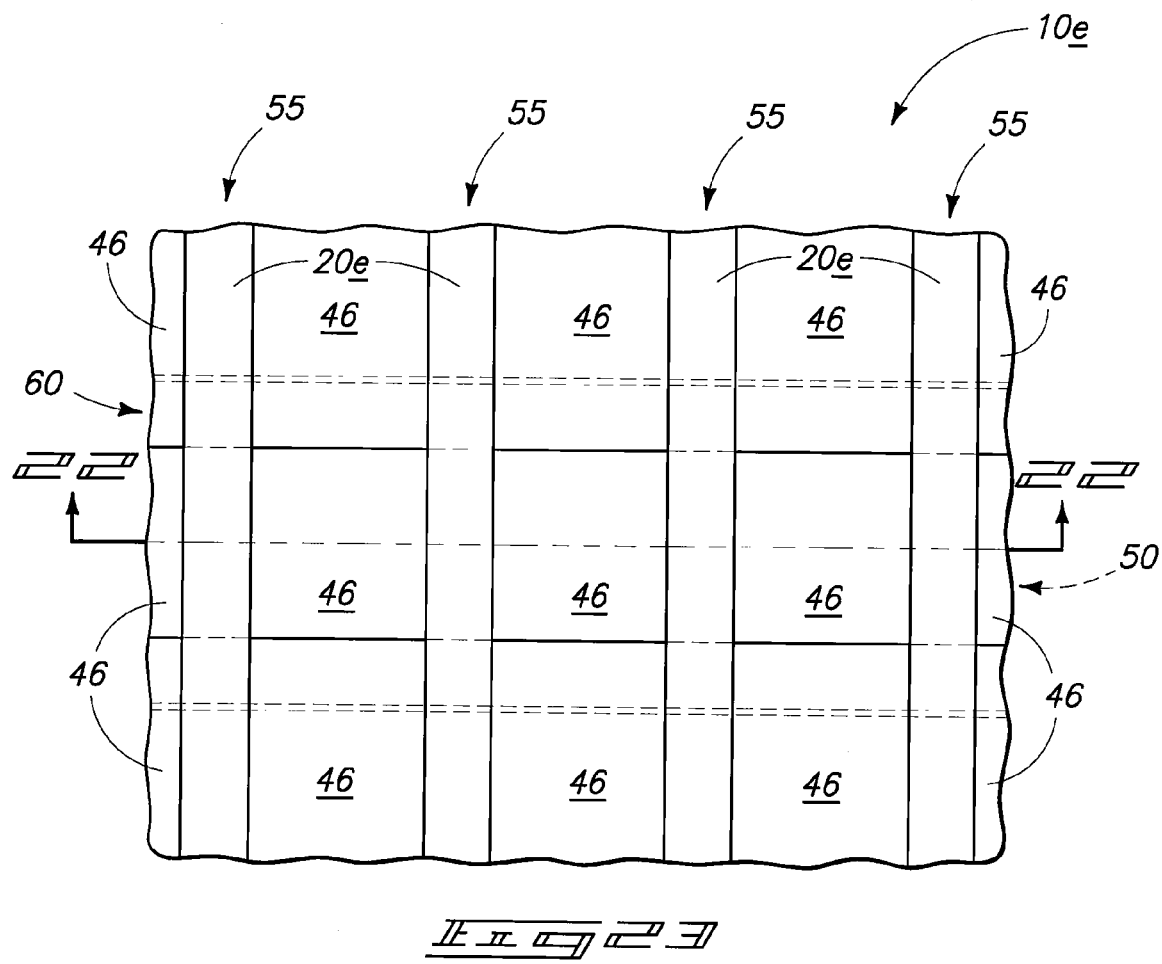
FIG. 23 is a top view of FIG. 21.

Referring to FIGS. 21-23, hydrogen and fluorine-containing organic polymer 18e received between spaced masking shields 55 as well as first photoresist 14e received there-under between spaced masking shields 55 have been etched to material 46. Spaced masking shields 55 have been used as a mask during such etch, and thereby a photoresist-comprising pattern 60 is formed on substrate 10e which comprises second photoresist 20e which is received over hydrogen and fluorine-containing organic polymer 18e which is received over first photoresist 14e. An example plasma etching chemistry for anisotropically etching through a hydrogen and fluorine-containing organic polymer 18e as well as through photoresist 14e includes $CF_4$ in combination with at least one of He and $O_2$.

Figure 24:
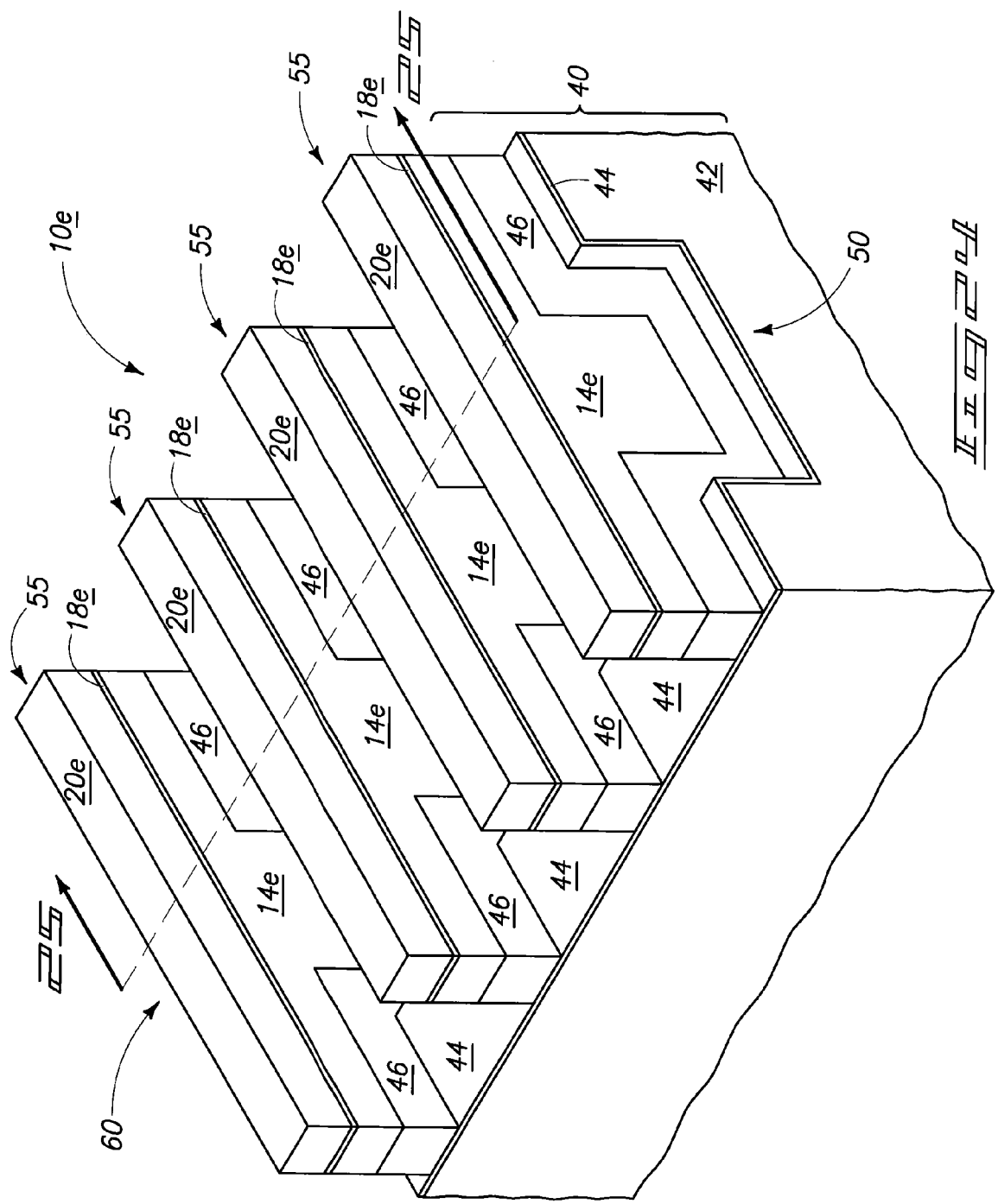
FIG. 24 is a view of the FIG. 21 substrate at a processing subsequent to that shown by FIG. 21.

FIGS. 24-26 depict using photoresist-comprising pattern 60 as an etch mask while etching exposed substrate material 46 selectively relative to etch stop layer 44. While such embodiment has been described relative to an etching function, ion implantation or other processing whether existing or yet-to-be-developed using a photoresist-comprising pattern, such as pattern 60, is also contemplated.

Figure 27:
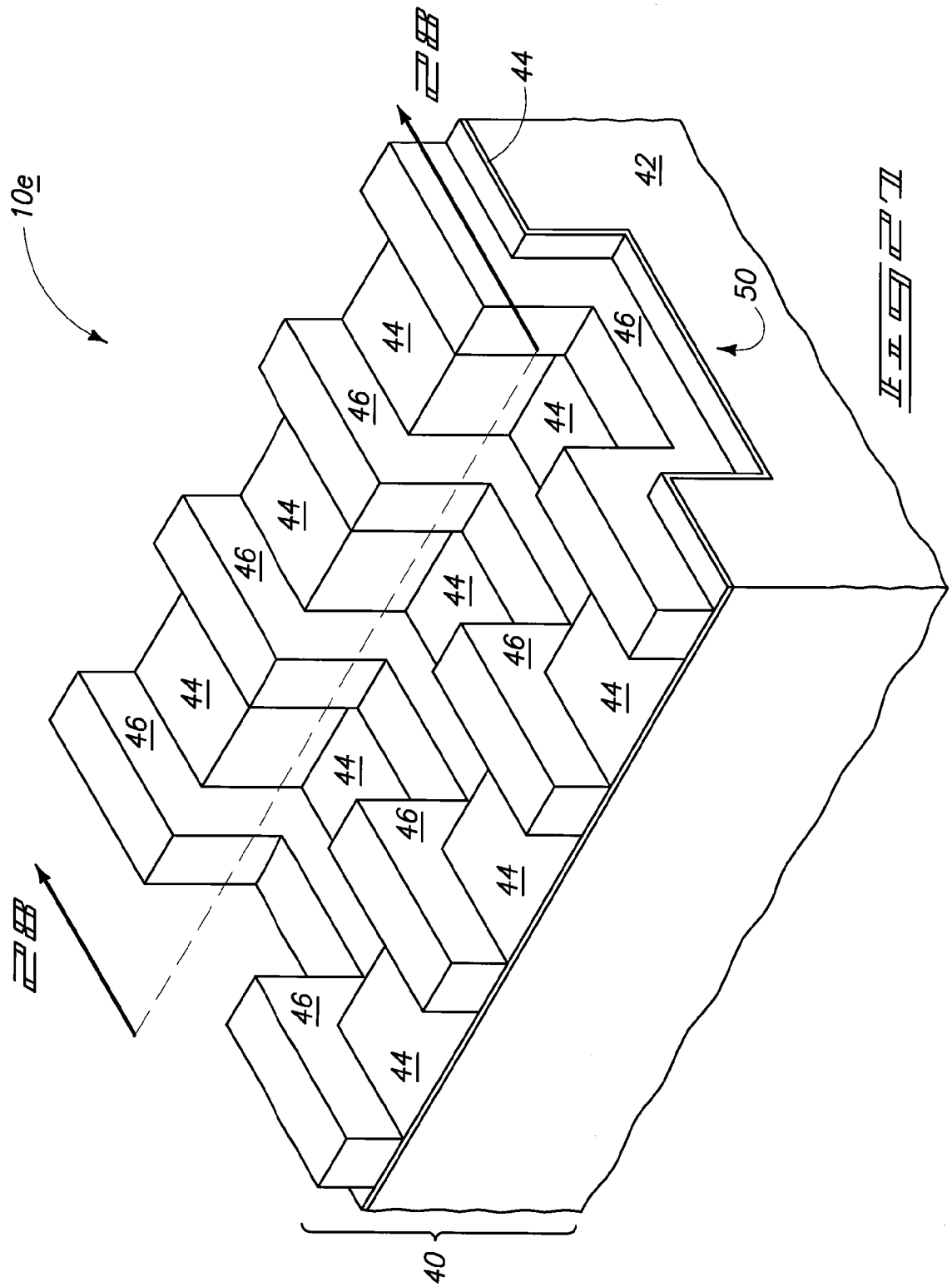
FIG. 27 is a view of the FIG. 24 substrate at a processing subsequent to that shown by FIG. 24.

FIGS. 27-29 depict subsequent removal of photoresist-comprising pattern 60 (not shown).

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a photoresist-comprising pattern on a substrate, comprising:
    forming a patterned first photoresist over a substrate, the patterned first photoresist comprising spaced first masking shields in at least one cross section;
    exposing the first masking shields to a fluorine-containing plasma to form a hydrogen and fluorine-containing organic polymer coating about outermost surfaces of the first masking shields;
    depositing a second photoresist over and in direct physical touching contact with the hydrogen and fluorine-containing organic polymer coating received about the first masking shields; and
    exposing the second photoresist which is in direct physical touching contact with the hydrogen and fluorine-containing organic polymer coating to a pattern of actinic energy and thereafter forming spaced second masking shields in the one cross section which comprise the second photoresist and correspond to the actinic energy pattern, the first and second masking shields together comprising a photoresist-comprising pattern on the substrate.

2. The method of claim 1 wherein the second masking shields are spaced from the first masking shields in the one cross section.

3. The method of claim 1 wherein at least a portion of the second masking shields are received elevationally atop the first masking shields in the one cross section.

4. The method of claim 1 wherein the spaced first masking shields prior to said exposing have lateral dimensions and spacings between adjacent of the first masking shields in the one cross section, said exposing not changing said dimensions and said spacings.

5. The method of claim 1 wherein the spaced first masking shields prior to said exposing have lateral dimensions and spacings between adjacent of the first masking shields in the one cross section, said exposing changing said dimensions and said spacings.

6. The method of claim 1 wherein the first photoresist and the second photoresist are of the same composition.

7. The method of claim 1 wherein the first photoresist and the second photoresist are of different composition.

8. The method of claim 1 wherein the first photoresist and the second photoresist are of the same type regarding positive and negative.

9. The method of claim 8 wherein the first photoresist and the second photoresist are positive type.

10. The method of claim 8 wherein the first photoresist and the second photoresist are negative type.

11. The method of claim 1 wherein the first photoresist and the second photoresist are of different type regarding positive and negative.

12. The method of claim 1 comprising etching substrate material received elevationally inward of the first photoresist using the photoresist-comprising pattern as an etch mask during such etching.

13. The method of claim 12 being void of etching any substrate material received elevationally inward of the first photoresist between forming of the first masking shields comprising the coating and forming of the second masking shields.

14. The method of claim 1 being void of any exposure of the substrate to baking between formation of the hydrogen and fluorine-containing organic polymer coating and the deposition of second photoresist.

15. The method of claim 1 being void of any exposure of the substrate to liquid between formation of the hydrogen and fluorine-containing organic polymer coating and the deposition of second photoresist.

16. A method of forming a photoresist-comprising pattern on a substrate, comprising:
   forming a patterned first photoresist over a substrate, the patterned first photoresist comprising spaced first masking shields in at least one cross section;
   within a chamber, etching the first masking shields to reduce their respective widths in the one cross section;
   within the chamber and after the etching, exposing the spaced first masking shields to a fluorine-containing plasma to form a hydrogen and fluorine-containing organic polymer coating about outermost surfaces of the reduced-width first masking shields, the substrate not being removed from the chamber between said etching and said exposing;
   depositing a second photoresist over the hydrogen and fluorine-containing organic polymer coating received about the first masking shields; and
   patterning the second photoresist to form spaced second masking shields in the one cross section which comprise the second photoresist, the first and second masking shields together comprising a photoresist-comprising pattern on the substrate.

17. The method of claim 16 wherein the second photoresist is deposited in direct physical touching contact with the hydrogen and fluorine-containing organic polymer coating received about the first masking shields.

18. The method of claim 16 comprising forming the fluorine-containing plasma using a gas comprising at least one of a fluorocarbon, a hydrofluorocarbon, and $NF_3$, including any mixtures thereof.

19. The method of claim 16 wherein the etching also reduces elevation of the first masking shields.

20. The method of claim 19 wherein the etching reduces more width than elevation of the first masking shields.

21. The method of claim 19 wherein the etching reduces more elevation than width of the first masking shields.

22. The method of claim 19 wherein the etching reduces equal width and elevation of the first masking shields.

23. The method of claim 16 wherein the etching comprising injecting an etching gas into the chamber and the exposing comprises injecting a fluorine-containing gas other than the etching gas into the chamber, said injecting of the etching gas being ceased prior to initiating said injecting of the fluorine-containing gas.

24. The method of claim 16 wherein the etching comprising injecting an etching gas into the chamber and the exposing comprises injecting a fluorine-containing gas other than the etching gas into the chamber, said injecting of the etching gas not being ceased prior to initiating said injecting of the fluorine-containing gas.

25. The method of claim 16 wherein the etching comprises plasma etching.

26. The method of claim 16 wherein the fluorine-containing plasma comprises plasma generation within the chamber.

27. The method of claim 16 wherein the fluorine-containing plasma comprises plasma generation remote from the chamber.

28. A method of forming a photoresist-comprising pattern on a substrate, comprising:
   forming a patterned first photoresist over a substrate, the patterned first photoresist comprising spaced first masking shields in at least one cross section;
   exposing the spaced first masking shields to a plasma, the plasma simultaneously comprising a reactive component which modifies respective widths of the first masking shields in the one cross section and a fluorine-containing component other than the reactive component which forms a hydrogen and fluorine-containing organic polymer coating about outermost surfaces of the modified-width first masking shields;
   depositing a second photoresist over the hydrogen and fluorine-containing organic polymer coating received about the first masking shields; and
   patterning the second photoresist to form spaced second masking shields in the one cross section which comprise the second photoresist, the first and second masking shields together comprising a photoresist-comprising pattern on the substrate.

29. The method of claim 28 wherein the exposing reduces respective widths of the first masking shields in the one cross section.

30. The method of claim 28 wherein the exposing increases respective widths of the first masking shields in the one cross section.

31. The method of claim 28 wherein the second photoresist is deposited in direct physical touching contact with the hydrogen and fluorine-containing organic polymer coating received about the first masking shields.

32. The method of claim 28 wherein the reactive component is derived from $O_2$ and at least one of $Cl_2$ and HBr, including mixtures thereof.

33. The method of claim 28 being void of any exposure of the substrate to baking between formation of the hydrogen and fluorine-containing organic polymer coating and the deposition of second photoresist.

34. A method of forming a photoresist-comprising pattern on a substrate, comprising:

forming a first photoresist over a substrate, the first photoresist having a planar elevationally outermost surface;

exposing the first photoresist to a fluorine-containing plasma to form a hydrogen and fluorine-containing organic polymer coating on the planar elevationally outermost surface;

depositing a second photoresist over and in direct physical touching contact with the hydrogen and fluorine-containing organic polymer coating received on the planar elevationally outermost surface of the first photoresist;

patterning the second photoresist to form spaced masking shields in at least one cross section which comprise the second photoresist, the patterning comprising etching the second photoresist to stop on the hydrogen and fluorine-containing organic polymer coating; and after stopping the etching on the hydrogen and fluorine-containing organic polymer coating, etching the hydrogen and fluorine-containing organic polymer coating received between the spaced masking shields and the first photoresist there-under between the spaced masking shields using the spaced masking shields as a mask to form a photoresist-comprising pattern on the substrate which comprises the second photoresist received over the hydrogen and fluorine-containing organic polymer coating received over the first photoresist.

35. The method of claim 34 wherein the substrate has a non-planar elevationally outermost surface immediately prior to forming the first photoresist.

36. The method of claim 34 wherein the first photoresist and the second photoresist are of different composition.

37. The method of claim 34 wherein the first photoresist and the second photoresist are of different type regarding positive and negative.

38. The method of claim 34 comprising forming the fluorine-containing plasma using a gas comprising at least one of a fluorocarbon, a hydrofluorocarbon, $NF_3$ and $N_2$, including any mixtures thereof.

* * * * *